United States Patent [19]

Takahashi

[11] Patent Number: 5,781,013
[45] Date of Patent: Jul. 14, 1998

[54] BATTERY MANAGEMENT SYSTEM FOR ELECTRIC VEHICLE

[75] Inventor: Tsutomu Takahashi, Oota, Japan

[73] Assignee: Fuji Jukogyo Kabushiki Kaisha, Tokyo, Japan

[21] Appl. No.: 545,156

[22] Filed: Oct. 19, 1995

[30] Foreign Application Priority Data

Oct. 26, 1994 [JP] Japan ................................. 6-262729
Nov. 9, 1994 [JP] Japan ................................. 6-275348

[51] Int. Cl.$^6$ ............................................. G01R 31/36
[52] U.S. Cl. ......................... 324/426; 340/636; 320/48
[58] Field of Search ........................... 324/426, 427, 324/428, 432, 433, 434, 436; 340/438, 636, 455; 364/424.05, 431.01; 320/48

[56] References Cited

U.S. PATENT DOCUMENTS

| | | |
|---|---|---|
| 3,500,167 | 3/1970 | Applegate et al. ............... 324/426 X |
| 4,377,787 | 3/1983 | Kikuoka et al. ................. 324/427 X |
| 4,994,728 | 2/1991 | Sasaki ........................... 324/427 X |
| 5,136,246 | 8/1992 | Sakamoto ....................... 324/433 |
| 5,451,881 | 9/1995 | Finger ........................... 324/427 X |

*Primary Examiner*—Michael Brock
*Attorney, Agent, or Firm*—Beveridge, DeGrandi, Weilacher & Young, LLP

[57] ABSTRACT

A battery monitoring routine is executed at a short period such as one minute as an initial value when a key switch is turned on to drive an electric vehicle (so that the battery is discharged). On the other hand, when the key switch is turned off to stop or park the electric vehicle so that the battery is released open from discharge, the battery monitoring routine is executed at a short period such as one minute to measure the battery data finely within a specified time such as 30 minutes, but at a long period such as one hour to measure the battery data coarsely after the specified time such as 30 minutes to save monitoring power. The battery deterioration can be monitored by measuring the restoration status of the battery after released open from discharge, for recharging or replacement of the battery.

26 Claims, 15 Drawing Sheets

BATTERY MANAGEMENT SYSTEM FOR ELECTRIC VEHICLE

BACKGROUND OF THE INVENTION

The present invention relates to a battery management system for an electric vehicle, and more specifically to battery management system for monitoring the status such as a remaining battery capacity of a high voltage battery mounted on the electric vehicle by detecting various battery conditions, for example, terminal voltage, temperature, etc.

Recently, an electric vehicle has been developed more and more. In the electric vehicle, it is important to always detect the status of the battery mounted thereon, so that various battery management system have been so far proposed.

For instance, Japanese patent application laid-open (Kokai) No. 5-227603 (1993) discloses such a battery management system that: various drive data related to an electric vehicle (e.g., vehicle starting and traveling conditions) detected by various vehicle sensors and various data related to battery charged status such as charge time, charged capacity or the number of charged times, which is detected by various battery sensors are recorded in an IC (integrated circuit) card; and that the remaining battery capacity is read and displayed for the driver where necessary, so that the car battery can be charged timely and effectively.

Further, Japanese patent application laid-open (Kokai) No. 6-54402 (1994) discloses a battery management system such that: the remaining capacity of the battery can be obtained accurately, with the use of a bi-directional power capacity meter for detecting a power capacity of the battery mounted on an electric vehicle; reading means for reading battery-related data such as specific battery data, history data, from a recording medium as battery power correction data for correcting the battery power capacity; and calculating means for calculating a corrected battery power capacity on the basis of the power capacity detected by the bi-directional power capacity meter and the correction data obtained by the reading means.

In the above-mentioned prior art battery management system, however, it is necessary to always obtain the correction value of the remaining capacity of the vehicle drive battery, by detecting the battery terminal voltage, the battery temperature and the time elapsed after released open from discharge, not only during traveling but also when the key switch is kept turned off (i.e., when the electric vehicle is kept stopped or parked at night or for many hours in daytime).

In this method, however, since the current consumed for a battery management system is relatively large, when the battery management system is kept activated, even after the key switch has been turned off such as during a parking, there exists a possibility that the car battery is used up.

Here, the reason why the battery must be monitored even after the battery is released open from discharge, will be explained hereinbelow with reference to FIGS. 1(a) to 1(e).

As shown in FIG. 1(a), when the electric vehicle is stopped and further the key switch is turned off at $t_0$; that is, the terminal battery voltage is restored relatively sharply up to a peak value after about 30 minutes at $t_1$ when the battery is released open. After that, the terminal voltage begins to decrease gradually. Here, the time between $t_0$ and $t_1$ is referred to as a specific time $T_p$. FIG. 1(b) shows this restoration status in an enlarged scale, which indicates that it is possible to know the deterioration status of the drive battery by measuring the restoration rate ($\Delta V/\Delta t$) of the terminal voltage with the lapse of time. In other words, a criterion for exchange the battery with new one can be known.

However, this restoration rate of the battery obtained immediately after the battery has been released open differs according to the past discharge status of the battery. FIG. 1(c) shows an example where a small power is discharged for a long time; FIG. 1(d) shows another example where a large power is discharged for a short time; and FIG. 1(e) shows the other example where a small power is discharged for a medium time.

Therefore, when the battery is always monitored so often, even after the key switch has been turned off in the same way as with the case where the key switch is turned on, there exists a problem in that the current consumption required for the battery management system increases, with the result that the battery is used up for battery management or monitoring.

SUMMARY OF THE INVENTION

With these problems, therefore, there is the object of the present invention to provide a battery management system for an electric vehicle, which can monitor the battery status (e.g., remaining capacity) even after the key switch has been kept turned off (i.e., even when the electric vehicle is kept parked), without consuming a large current for a management or monitoring of the battery.

To achieve the above-mentioned object, the present invention provides a car battery management system, comprising: detecting means (11) for detecting various conditions of a car battery (4) mounted on an electric vehicle; management means (9, 10; 14, 15, 32) for monitoring status of the battery on the basis of the various battery conditions detected by the detecting means to manage the monitored battery; storing means (12) for storing the battery status monitored by the monitoring means; key switching means (17) connected to an auxiliary battery (8), for activating the detecting means and the control means whenever turned on; and activating means (13, 16, 33, 35, 36; 14, 32) associated with the key switching means (17), for activating the detecting means and the management means at a long monitoring start period when the key switching means (17) is turned off, under management of the management means, to keep monitoring the car battery even after the key switching means has been turned off, while reducing monitoring power consumption.

In the first aspect of the present invention, the activating means includes: a real time clock generator (13) for generating a clock signal; and a first switching element (16) connected in parallel to the key switching means, for supplying a power to the detecting means and the management means in response to the clock generated by the real time clock generator, the real time clock generator and the first switching element being both connected to the auxiliary battery (8).

In a modification of the first aspect according to the present invention, the system further comprises a backup battery (21) for activating the real time clock generator, the backup battery being recharged by a battery charger (22) activated when the key switching means (17) is turned on.

In the second aspect of the present invention, the system further comprises a diode (25) connected between two of the separated detecting means, to reduce the number of detecting means activated when the key switching means is turned off.

In the third aspect of the present invention, the system further comprises: a second switching element (31) connected between the real time clock generator (13) and the first switching element (16): and a thyristor (33) connected to the second switching element and activated by the management means (32). to activate said detecting means and the management means only during a monitoring routine is being executed.

In the fourth aspect of the present invention. the system further comprises: a relay (35) connected in parallel to the key switching means (17): and a charge coupler (36) for energizing the relay to supply an external power (37) to the detecting means (11) and the management means (14) for continuously monitoring the car battery, only when the car battery is being charged.

In a modification of the fourth aspect of the present invention. the system further comprises a charge coupler (36) for supplying an external power (37) directly to the detecting means (11) and the management means (14) continuously for monitoring the car battery, only when the car battery is being charged.

Here. the various battery conditions detected by the detecting means (11) are a terminal voltage. a terminal temperature. a discharged current. and a time elapsed after released open from discharge. Further. the battery status monitored and managed by the management means is a power consumption rate. a remaining battery capacity. and a battery deterioration.

Further. it is preferable that the monitoring start period ($\Delta T$) of the activating means (13) is determined on the basis of restoration status of battery terminal voltage obtained after the battery has been released open from discharge. Here. the restoration status of the battery terminal voltage is represented by a specified time ($T_p$) from when the car battery has been released open from discharge to when the terminal voltage is restored to a peak value. a restoration voltage ($\Delta V$) between a terminal voltage immediately before released open and the peak value. and a restoration rate ($\Delta V/\Delta t$ or $\Delta V/T_p$).

Further. in the fifth aspect of the present invention. the monitoring start period ($\Delta T$) of the activating means (13) is determined on the basis of a fixed specified value ($T_p$) representative of the restoration status of battery terminal voltage. in such a way as to be short within the fixed specified time ($T_p$) but long after the fixed specific time.

Further. in the sixth aspect of the present invention. the monitoring start period ($\Delta T$) of the activating means (13) is determined on the basis of a restoration voltage ($\Delta V$) representative of the restoration status of battery terminal voltage. in such a way as to be short when the restoration voltage ($\Delta V$) is equal to or higher than a reference voltage ($V_{ref}$) but long when lower than the reference voltage. Further. the reference voltage ($V_{ref}$) can be set to zero volts.

Further. in the seventh aspect of the present invention. the monitoring start period ($\Delta T$) of the activating means (13) is determined on the basis of variable fixed specified values ($T_p$) representative of the restoration status of battery terminal voltage. in such a way as to be relatively short when an integrated discharged power ($\Sigma PI_{(t)}$) is relatively small but relatively long when the integrated discharged power ($\Sigma PI_{(t)}$) is large.

Further. in the eighth aspect of the present invention. the monitoring start period ($\Delta T$) of the activating means (13) is determined on the basis of a fixed specified value representative of the restoration status of battery terminal voltage. in such a way as to be short within the fixed specified time ($T_p$) but long after the fixed specific time. the determined short monitoring starting period ($\Delta T$) being further adjusted in such a way as to be relatively long when an integrated discharged power ($\Sigma PI_{(t)}$) is relatively small but relatively short when the integrated discharged power ($\Sigma PI_{(t)}$) is large.

Here. the specified time ($T_p$) and the short monitoring start period ($\Delta T$) can be determined with reference to a map determined empirically. respectively.

Further. the present invention provides a method of monitoring a car battery mounted on an electric vehicle: checking whether a real time clock (RTC) is being started to activate a battery monitoring routine intermittently after the battery is released open from discharge (S101); executing a battery monitoring routine at a short monitoring start period (S103) when the RTC is not being started to activate the battery monitoring routine; determining a relatively long monitoring start period ($\Delta T$) according to restoration status of battery terminal voltage obtained after the car battery has been released open from discharge when the RTC is being started to activate the battery monitoring routine; changing the period (T1) of the real time clock to the determined monitoring start period ($\Delta T$). to activate the battery monitoring routine at a relatively long monitoring start period, for saving the monitoring power (S109); and processing monitored battery data to detect battery status for recharging or replacement (S110).

In the fifth embodiment of the present invention. the step of determining a relatively long monitoring start period ($\Delta T$) according to restoration status of battery terminal voltage comprises the steps of: integrating time elapsed after the car battery has been released open from discharge (S105); checking whether the integrated time value is equal to or longer than a fixed specified time (S106); setting a long monitoring start period ($\Delta T$)(S107) when the integrated time value is equal to or longer than the fixed specified time; and setting a short monitoring start period (S103) when the integrated time value is shorter than the fixed specified time.

Further. in the sixth aspect of the present invention. the step of determining a relatively long monitoring start period ($\Delta T$) according to restoration status of battery terminal voltage comprises the steps of: integrating terminal voltage change ($\Delta V$) after the battery has been released open from discharge (S202); checking whether the integrated terminal voltage ($\Delta V$) is equal to or higher than a reference voltage ($V_{ref}$) (S203); setting a short monitoring start period ($\Delta T$) (S205) when the integrated terminal voltage ($\Delta V$) is equal to or higher than the reference voltage ($V_{ref}$); and if no. setting a long monitoring start period (S205) when the integrated terminal voltage ($\Delta V$) is lower than the reference voltage ($V_{ref}$). Here. the reference voltage ($V_{ref}$) can be set to zero volts.

In the seventh aspect of the present invention. the step of determining a relatively long monitoring start period ($\Delta T$) according to restoration status of battery terminal voltage further comprises the steps of: integrating power ($\Sigma PI_{(t)}$) discharged from the car battery when the real time clock (RTC) is not being generated (S302); and determining the specified time ($T_p$) on the basis of the integrated discharged power (S303). in such a way as to be relatively short when an integrated discharged power ($\Sigma PI_{(t)}$) is relatively small but relatively long when the integrated discharged power ($\Sigma PI_{(t)}$) is large.

Further. in the eighth aspect of the present invention. the step of determining a long monitoring start period ($\Delta T$) according to restoration status of battery terminal voltage further comprises the steps of: integrating power ($\Sigma PI_{(t)}$) discharged from the car battery when the real time clock (RTC) is not being generated (S402); and determining the short monitoring start period (ΔT) on the basis of the integrated discharged power (S403), in such a way as to be long when an integrated discharged power (ΣPI$_{(t)}$) is relatively small but short when the integrated discharged power (ΣPI$_{(t)}$) is large.

Further, the specified time (T$_p$) and the short monitoring start period (ΔT) are both determined with reference to a map determined empirically, respectively.

As described above, in the battery management system according to the present invention, whenever the key switch is kept turned on so that the car battery is discharged, the battery monitoring routine is executed at a short period. On the other hand, when the key switch is turned off to stop or park the electric vehicle so that the car battery is released open from discharge, the battery monitoring routine is executed at a short period to measure the battery data finely within a specified time, but a long period to measure the battery data coarsely after the specified time to save monitoring power. The battery deterioration can be monitored by measuring the restoration status of the car battery after released open from discharge, for recharging or replacement. It is possible to save power required for always monitoring and managing the car battery status because the battery status can be kept monitored intermittently at a long monitoring period.

BRIEF DESCRIPTION OF THE DRAWINGS

FIGS. 1(a) to 1(e) are graphical representations for assistance in explaining the terminal voltage change with the lapse of time after the car battery is released open, in which FIG. 1(a) shows a state where the electric vehicle is stopped and further the key switch is turned off at to and thereby the terminal voltage is restored to a peak value at t$_1$; FIG. 1(b) shows an enlarged representation thereof; FIG. 1(c) shows a state where a small power is discharged for a long time; FIG. 1(d) shows a state where a large power is discharged for a short time; and FIG. 1(e) shows a status where a small power is discharged for a medium time, respectively;

DETAILED DESCRIPTION OF THE EMBODIMENTS

Preferred embodiments of the present invention will become understood from the following detailed description referring to the accompanying drawings.

(First embodiment)

Figure 2:
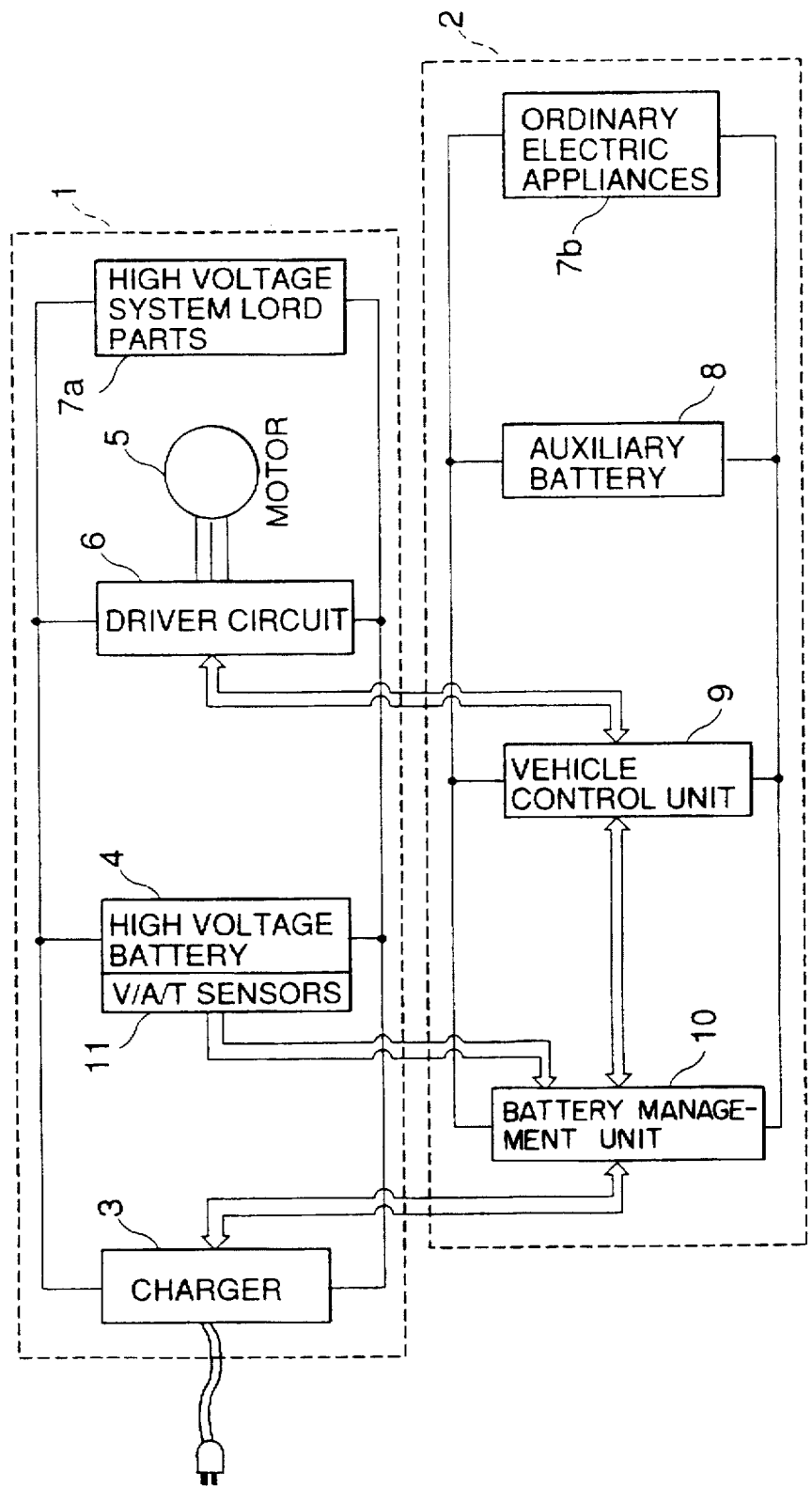
FIG. 2 is a system diagram showing a power system of an electric vehicle according to the present invention.

FIG. 2 shows a battery management system of an electric vehicle. The battery management system is roughly divided into a high voltage system 1 and a low voltage system 2.

The high voltage system 1 comprises a high voltage battery 4 connected to a vehicle drive motor 5 via a driver circuit such as inverter and directly to a high voltage system electric load parts 7a such as air conditioner, heater and the like. The high voltage battery 4 of nominal 336 V (=28× 12V) is formed by connecting 28 unit cells of nominal 12 V. Further, each unit cell (12V 6≈2.1V) is composed of six lead (Pb) battery of 2.1V. The high voltage battery 4 can be charged by an external power source through a battery charger 3.

Figure 3:
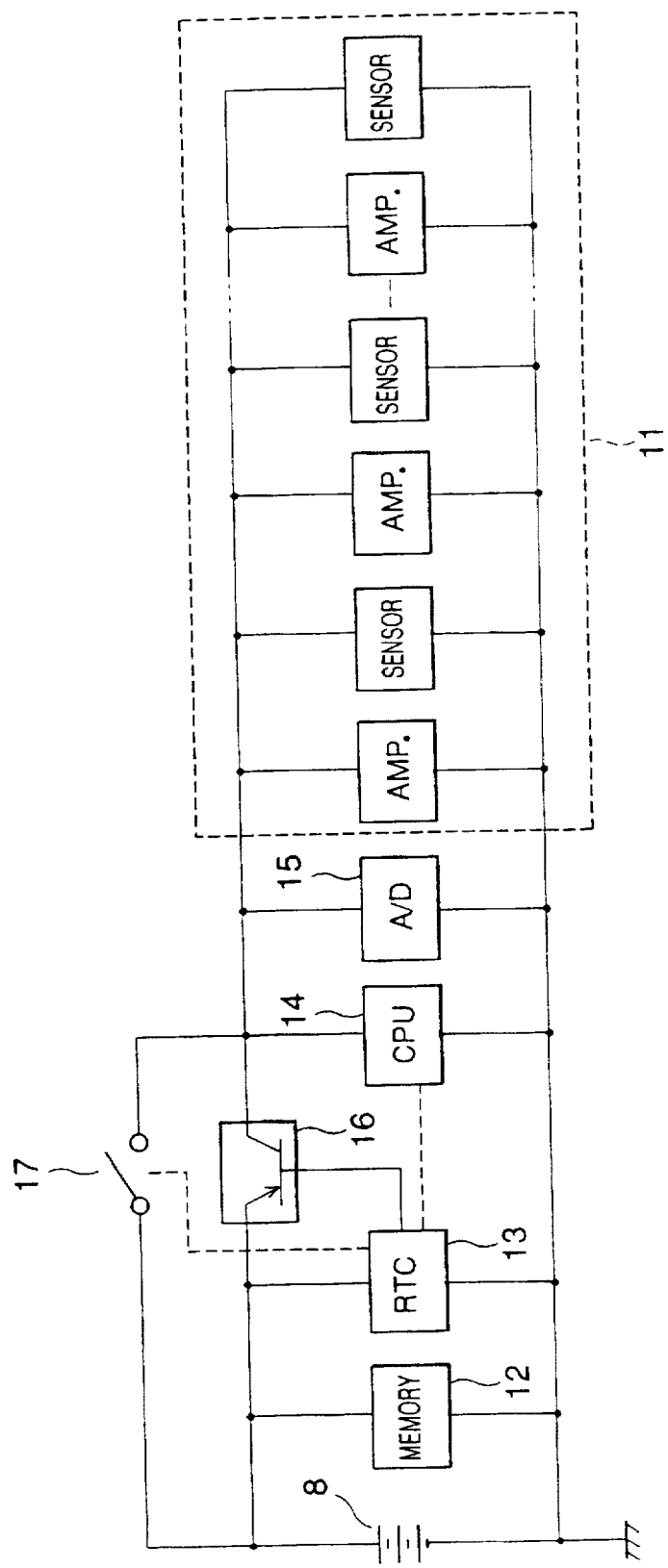
FIG. 3 is a system diagram showing a battery management system of the electric vehicle, according to the first embodiment of the present invention.

Further, as a plurality of battery status detecting means, a sensor and amplifier group 11 as shown in FIG. 3 is connected to the high voltage battery 4, to detect each unit cell or each battery cell block composed of a plurality of unit cells. Each of these sensors detects a terminal voltage (V), a temperature (T) and a battery current (A) for each cell or for each block.

The vehicle drive motor 5 is comprised of an AC induction motor, for instance, and a driving power of this drive motor 5 is transmitted to a vehicle drive system such as propeller shaft, differential gear, wheel shafts and the like.

On the other hand, the low voltage system 2 is composed of an auxiliary battery 8 which is different from the high voltage battery 4 and connected to the ordinary electric appliances such as wiper, radio and the like, and a vehicle control unit 9 and a battery management unit 10 (a battery management system according to the present invention). The auxiliary battery 8 of 12V (≈2.1V×6) is formed by connecting six cells.

The vehicle control unit 9 obtains various vehicle operating conditions in dependency on various signals applied by the battery management unit 10, the driver circuit 6, and the various sensors (not shown), and displays these obtained data for the driver. Further, the vehicle control unit 9 controls the vehicle operation and other necessary operation in accordance with driver's commands.

The battery management unit 10 obtains the battery conditions of the high voltage battery 4 in dependency on the signals detected by the sensor group 11 provided for the high voltage battery 4, manages the charging operation from the battery charger 3 to the high voltage battery 4, outputs signals indicative of the status such as remaining battery capacity of the high voltage battery 4 to the vehicle control unit 9, and further manages the high voltage battery 4 on the basis of signals applied by the vehicle control unit 9.

FIG. 3 is a wiring diagram showing the battery management unit 10 and the sensor group 11. The battery management unit 10 is composed of a CPU 14, A/D converter 15, a memory element 12, and a real time clock (RTC) generator 13. Further, the sensor group (detecting means) 11 includes a plurality of sensors for voltage, current, and temperature and a plurality of amplifiers each related to each sensor. In FIG. 3, the memory element 12 as the battery status storing means, and the real time clock (RTC) generator (activating means) 13 are directly connected to the auxiliary battery 8. However, the CPU 14 as the management means for monitoring battery status, the A/D converter 15 and the sensor group 11 are connected to the auxiliary battery 8 via a key switch 17. Further, in parallel to the key switch 17, a switching element 16 activated by the RTC generator 13 is connected.

Accordingly, the CPU 14, the A/D converter 15 and the sensor group 11 can be activated by power supplied by the auxiliary battery 8 to monitor and manage the high voltage battery 4, when any one of the key switch 17 and the switching element 16 is turned on.

The memory element 12 is composed of a ROM and a SRAM for storing the battery status calculated by the CPU 14 and various data (for example, in the form of maps and tables) for activating the CPU 14.

The CPU 14 detects and calculates the status such as the remaining capacity of the high voltage battery 4, in dependency on digital signals obtained by converting the analog signals of the various sensors of the sensor group 11 into digital signals, at each predetermined monitoring start period. The calculated battery status is stored in the memory element 12. The stored battery status is further outputted to the vehicle control unit 9 via a bus as shown in FIG. 2.

Figure 4:
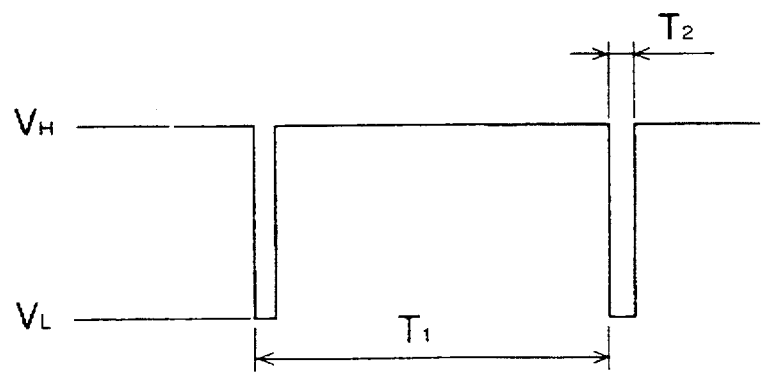
FIG. 4 is a waveform diagram showing a real time clock signal.

FIG. 4 shows a real time clock (RTC) signal outputted by the RTC generator 13. This clock signal is a periodic low-level voltage ($V_L$) having a time interval such as a pulse width $T_2$ and generated at each period $T_1$ for activating the sensor group 11 and the CPU 14. In this embodiment, the pulse period (i.e., monitoring start period) $T_1$ can be changed from one minute to one hour. On the other hand, the pulse width $T_2$ is fixed to 0.1 sec, for instance. Further, since the pulse width $T_2$ is determined under consideration of the processing speed of the CPU 14, $T_2$ can be set to a shorter value if the processing speed of the CPU 14 is high, but to a longer value if low.

The RTC generator 13 is activated in linkage with the actuation of the key switch 17 in such a way that only when the key switch 17 is turned off, the RTC signal is outputted to the switching element 16. Further, the pulse period $T_1$ of the RTC (clock) can be detected by the CPU 14, and further this pulse period $T_1$ can be changed freely by the CPU 14.

Further, the switching element 16 is a PNP transistor, and the RTC signal is applied to the base of this transistor. Therefore, when the RTC signal of a high level $V_H$ is applied to the base of the transistor, the switching element 16 is turned off. On the other hand, when the RTC signal (monitoring pulse) is at $V_L$, the switching element 16 is turned on. The RTC generator 13 and the switching element 16 form activating means for activating the sensor group 11 and the CPU 14 even after the key switch 17 has been turned off.

The operation of the above-mentioned battery management system will be described hereinbelow.

First, since the key switch 17 is kept turned on when the electric vehicle is traveling, as understood by FIG. 3, power is supplied from the auxiliary battery 8 to the CPU 14, the A/D converter 15 and the sensor group 11, so that the sensors of the sensor group 11 detect the battery conditions (e.g., terminal voltage, temperature, charge or discharge current, etc.) of each cell or each cell block at predetermined time intervals determined by the CPU 14.

The sensor signals of the sensor group 11 are converted into digital signals by the A/D converter 15. The CPU 14 calculates the battery status (e.g., power consumption rate, remaining battery capacity, battery deterioration, etc.) of the high voltage battery 4. The calculated battery status is stored in the memory element 12. The battery status stored in the memory element 12 is outputted to the vehicle control unit 9 via the bus.

On the other hand, the key switch 17 is turned off when the electric vehicle is kept parked. Under these conditions, however, since the RTC generator 13 is activated in linkage with the turn-off operation of the key switch 17, the switching element 16 is turned on periodically. Accordingly, the switching element 16 is turned on when the RTC signal of a pulse width $T_2$ changes to the low level $V_L$ for each monitoring start period $T_1$ (from one minute to one hour), so that power is supplied from the auxiliary battery 8 to the CPU 14, the A/D converter 15 and the sensor group 11. As a result, the sensors of the sensor group 11 detect the terminal voltages, temperature, and currents of each cell or each cell block at predetermined time intervals, even after the key switch 17 has been turned off.

The sensor signals of the sensor group 11 are converted into digital signals by the A/D converter 15. The CPU 14 calculates the battery status such as remaining battery capacity of the high voltage battery 4. The calculated battery status is stored in the memory element 12. The battery status stored in the memory element 12 is outputted to the vehicle control unit 9 via the bus.

As described above, in the first embodiment of the present invention, it is possible to monitor the battery status of the high voltage battery for driving the vehicle by the activating the CPU 14 and A/D converter 15 at a long monitoring start period determined by the RTC signals generated by the RTC generator 13, by reducing the power consumption required for monitoring the car battery even when the key switch is kept turned off.

Figure 5:
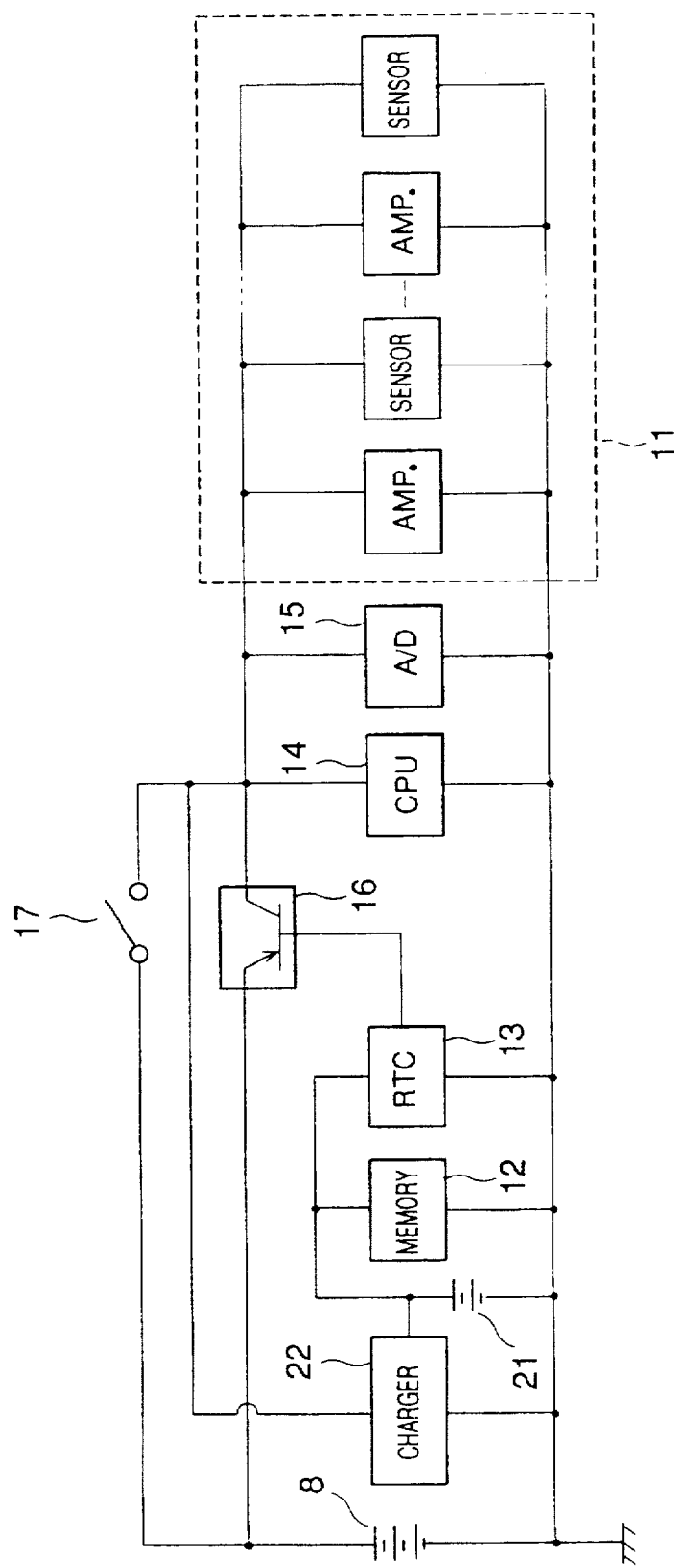
FIG. 5 is a system diagram showing a battery management system of an electric vehicle, according to a modification of the first embodiment of the present invention.

FIG. 5 shows a modification of the first embodiment. In this modification, the memory element 12 and the RTC generator 13 are activated by a rechargeable backup battery 21 which is different from the auxiliary battery 8. This backup battery 21 is charged by a battery charger 22 driven by the auxiliary battery 8, whenever the key switch 17 is turned on. Accordingly, since the memory element 12 and the RTC generator 13 can be activated by the backup battery 21 when the key switch 17 is turned off, it is possible to monitor the status of the high voltage battery 4, by further reducing the current consumption of the auxiliary battery 8.

(Second embodiment)

The second embodiment of the battery management system according to the present invention will be described hereinbelow with reference to FIG. 6. This second embodiment is different from the first embodiment in that the number of the activated sensors and activated amplifiers can be reduce to further reduced the current consumption after the key switch 17 has been turned off when the key switch 17 is turned off.

Figure 6:
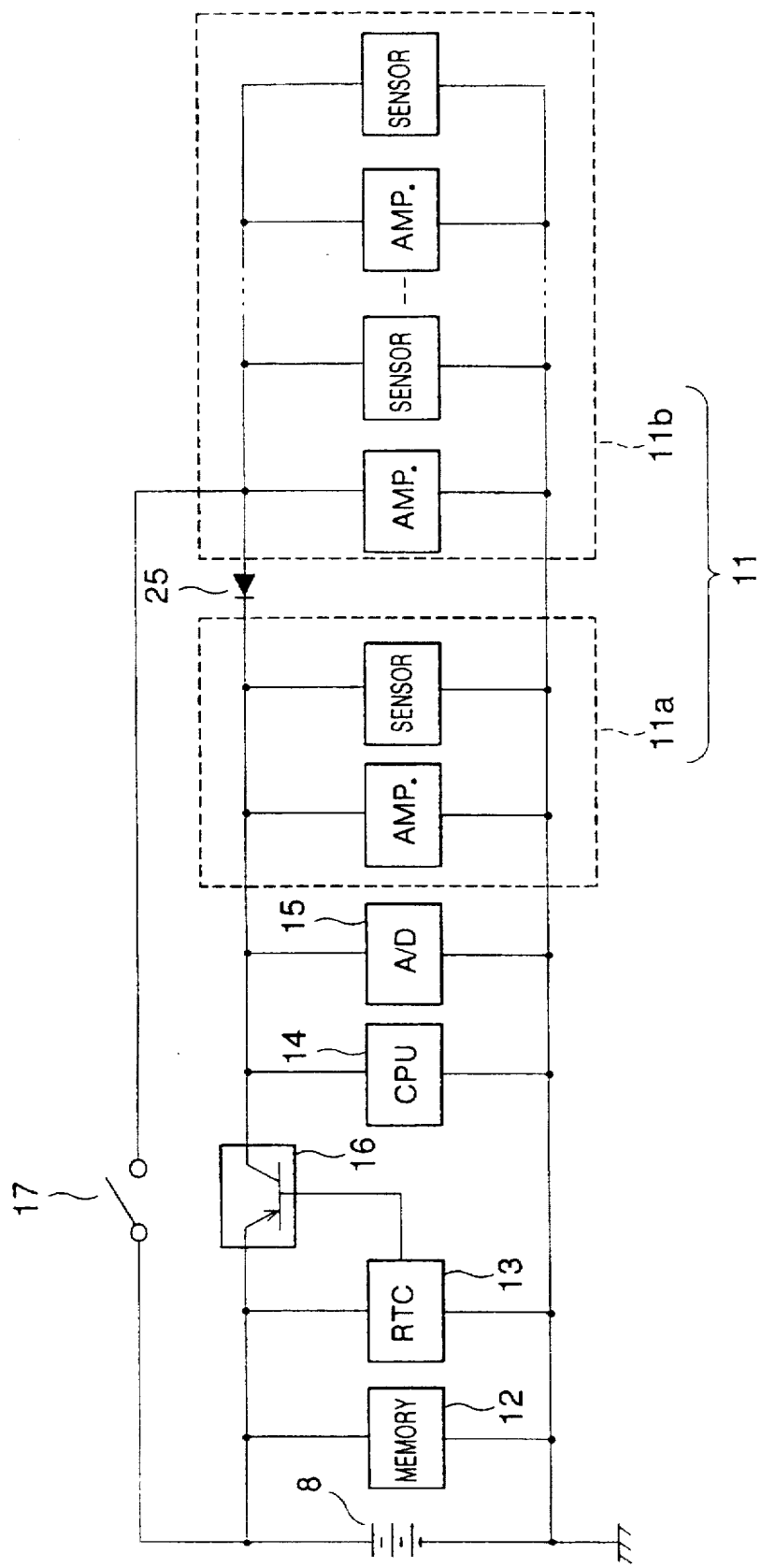
FIG. 6 is a system diagram showing a battery management system of an electric vehicle, according to the second embodiment of the present invention.

In more detail, as shown in FIG. 6, the sensor group 11 is divided into two types of a first group 11a activated periodically by the RTC signals even if the key switch 17 is turned off and a second group 11b perfectly deactivated when the key switch 17 is turned off. In more detail, the sensor group 11 is divided into two groups 11a and 11b by use of a diode 25 from the circuit standpoint. Therefore, since the sensor group 11b is not activated by the presence of the diode 25 when the key switch 17 is turned off and therefore the switching element 17 is turned on periodically, it is possible to monitor the status of the high voltage battery 4, by further reducing the current consumption of the auxiliary battery 8.

(Third embodiment)

The third embodiment of the battery management system according to the present invention will be described hereinbelow with reference to FIGS. 7 and 8. This third embodiment is different from the first embodiment in that power is stopped from being supplied from the auxiliary battery 8 to the CPU 32, the A/D converter 15, and the sensor group 11 in dependency on a signal outputted by the CPU 32 itself when the key switch 17 is turned off.

Figure 7:
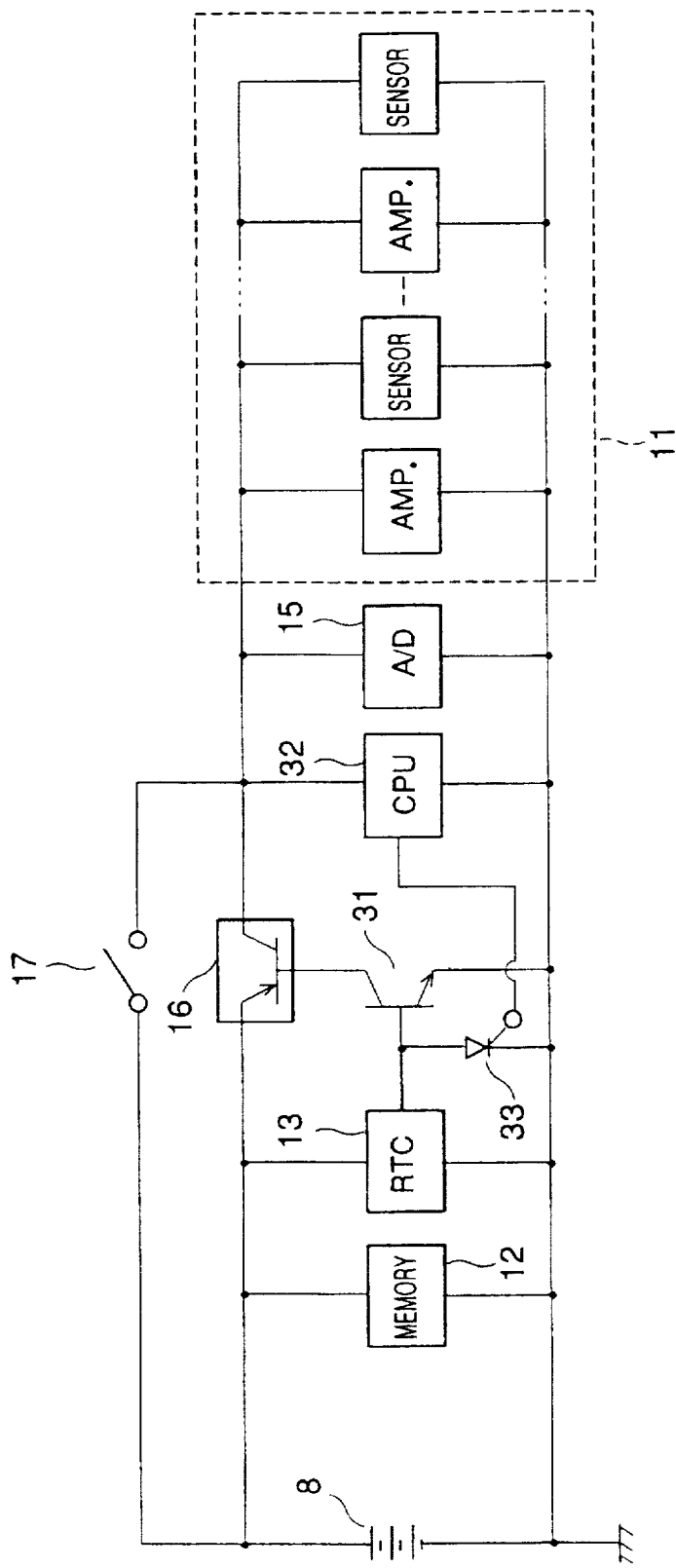
FIG. 7 is a system diagram showing a battery management system of an electric vehicle, according to the third embodiment of the present invention.

In more detail, in FIG. 7, the RTC generator 13 is connected to the base of an NPN transistor 31, and the collector of this NPN transistor 31 is connected to the base of the switching element 16. Further, the base of the NPN transistor 31 is connected to a thyristor 33 activated by the CPU 32.

The CPU 32 is provided with such a function for outputting a signal to the thyristor 33 whenever the CPU 32 ends predetermined calculations, in addition to the functions of the first embodiment.

Figure 8:
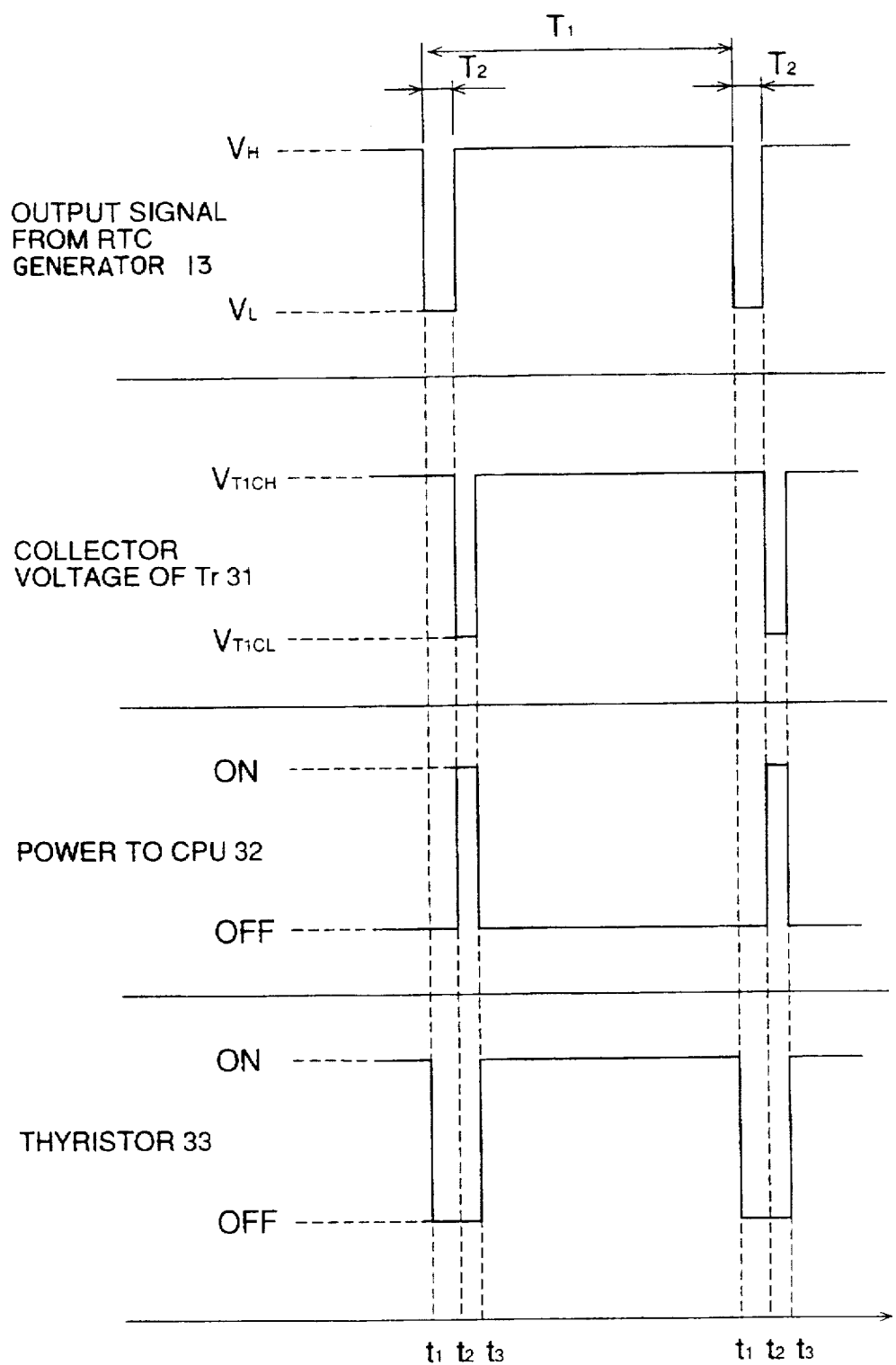
FIG. 8 is a timing chart for assistance in explaining the operation according to the third embodiment of the present invention.

In more detail, with reference to FIG. 8, the thyristor 33 is turned off and further the NPN transistor 31 is also turned off when the key switch 17 is turned off and thereby the signal level of the RTC generator 13 changes from $V_H$ to $V_L$ at time $t_1$. However, since the NPN transistor 31 is turned on when the signal level of the RTC generator 13 changes from $V_L$ to $V_H$ at time $t_2$ (when $T_2$ has elapsed after $t_1$), the collector voltage of the NPN transistor 31 changes from a high level ($V_{TICH}$) to a low level ($V_{TICL}$), so that the switching element 16 is turned on to supply power to the CPU 32, the A/D converter 15 and the sensor group 11.

Upon completion of the predetermined calculations, the CPU 32 outputs a signal to the thyristor 33 at time $t_3$, so that the thyristor 33 is turned on. Therefore, the NPN transistor 31 is turned off, and therefore the collector voltage of the NPN transistor 31 changes from the low level ($V_{TICL}$) to the high level ($V_{TICH}$). Accordingly, the switching element 16 is turned off to stop supplying power to the CPU 32, the A/D converter 15 and the sensor group 11.

As described above, in this third embodiment, since power is supplied only during the time period required for the predetermined calculations by the CPU 32 when the key switch 17 is turned off, it is possible to monitor the status of the high voltage battery 4, by further reducing the current consumption of the auxiliary battery 8.

(Fourth embodiment)

The battery management system according to the fourth embodiment of the present invention will be described hereinbelow with reference to FIG. 9. This fourth embodiment is different from the first embodiment at the point that the high voltage battery can be kept monitored as long as the battery is being charged, even if the key switch 17 is turned off, in the same way as with the case when the key switch 17 is kept turned on.

Figure 9:
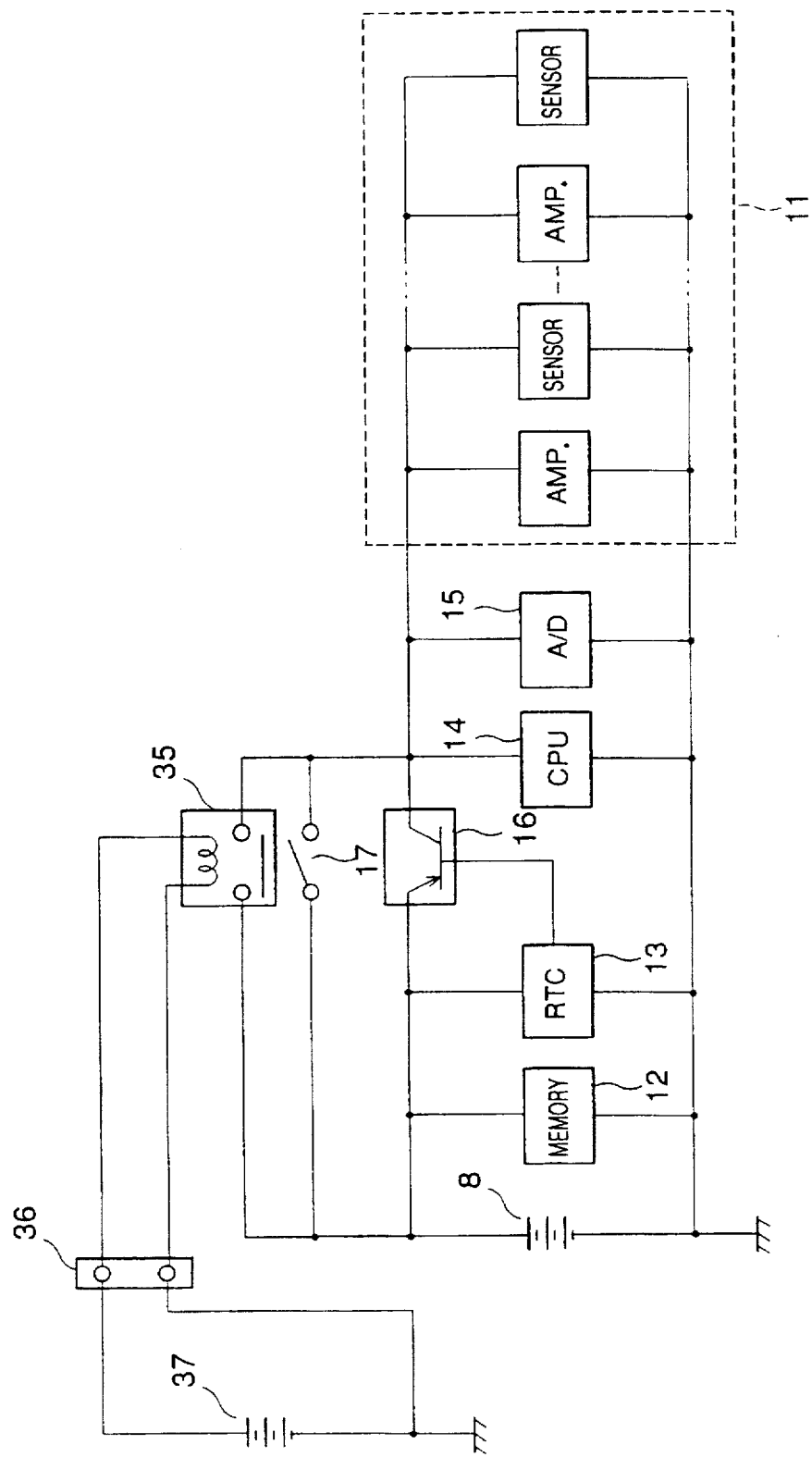
FIG. 9 is a system diagram showing a battery management system of an electric vehicle, according to the fourth embodiment of the present invention.

In more detail, in FIG. 9, the auxiliary battery 8 is connected to the CPU 14, the A/D converter 15, and the sensor group 11 via a relay 35 connected in parallel to the key switch 17. Further, the relay 35 is energized or deenergized via a charge coupler 36 turned on or off by an external power source 37. Accordingly, since the relay 35 can be energized by the external power source 37 as long as the battery 4 is being charged, even if the key switch 17 is turned off, it is possible to monitor the high voltage battery, as if the key switch 17 is turned on at a short monitoring start period.

Figure 10:
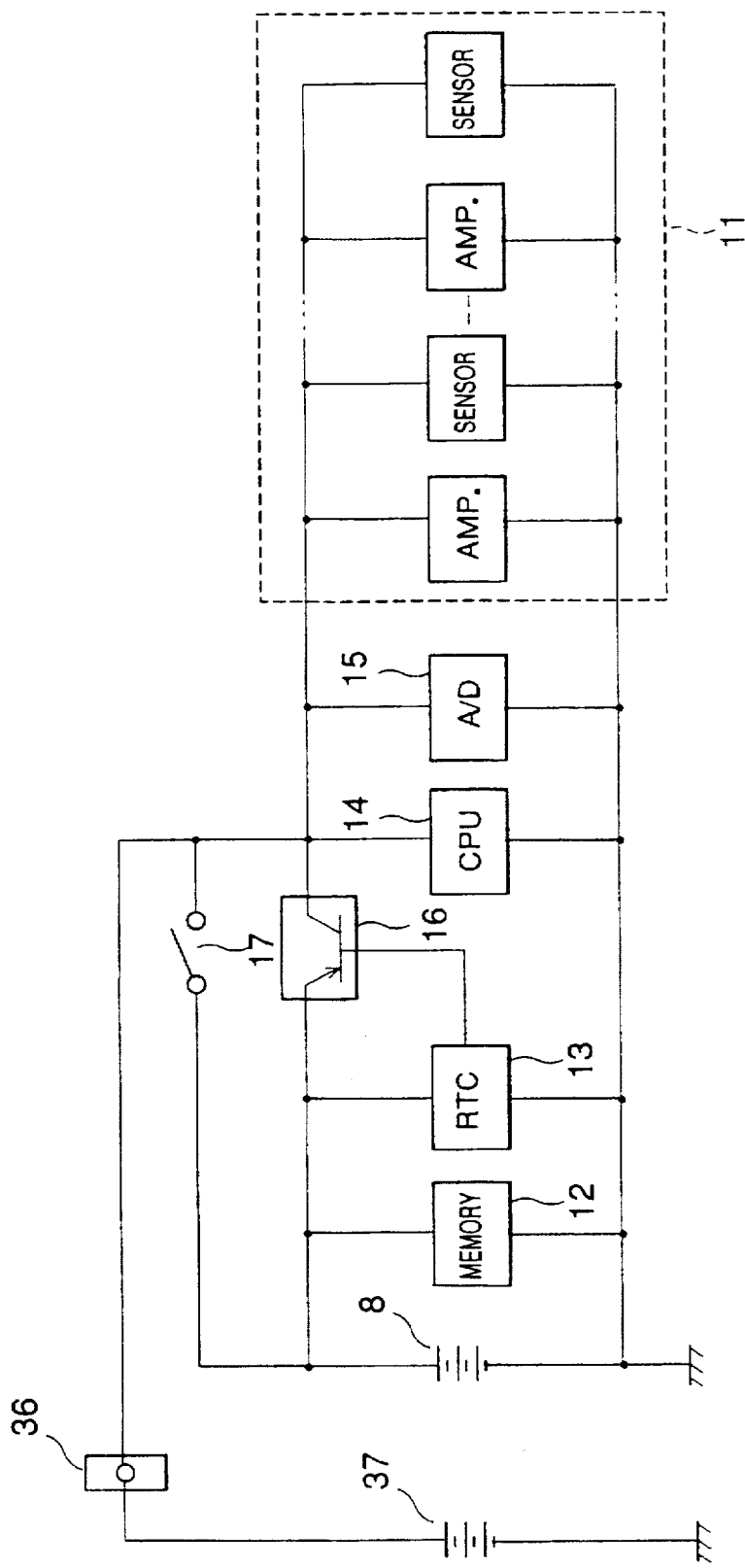
FIG. 10 is a system diagram showing a battery management system of an electric vehicle, according to a modification of the fourth embodiment of the present invention.

FIG. 10 shows a modification of the fourth embodiment. In this modification, since an external power source can be directly connected to the CPU 14, the A/D converter 15, and the sensor group 11 via the coupler 36 as long as the battery is being charged, when the key switch 17 is turned off, it is possible to monitor the status of the high voltage battery 4, by further reducing the current consumption of the auxiliary battery 8.

Further, in the above-mentioned embodiments, although the AC induction motor is used as the vehicle drive motor, without being limited only thereto, it is of course possible to use an AC synchronous motor or a DC motor.

Further, in the above-mentioned embodiment, although the real time clock is determined in such a way that the low-level pulse width $T_2$ is 0.1 second and the pulse period $T_1$ is from one minute to one hour, the real time clock is of course not limited only thereto.

Further, in the above-mentioned embodiment, although the lead battery is explained by way of example, the present invention can be applied to the other battery such as Ni—Cd, Ni—H, Ni—Zn, Na—S, Li battery and the like.

As described above, in the battery management system according to the present invention, since the battery status can be kept monitored intermittently whenever the key switch is kept turned off, it is possible to save power required for always monitoring and managing the battery status.

Figure 1A:
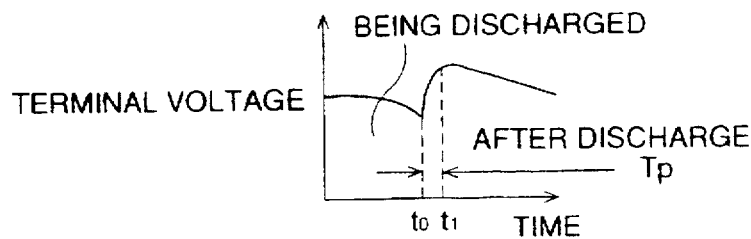
Figure 1B:
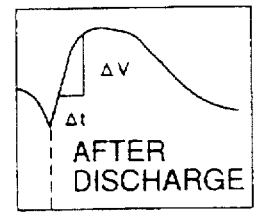
Figure 1C:
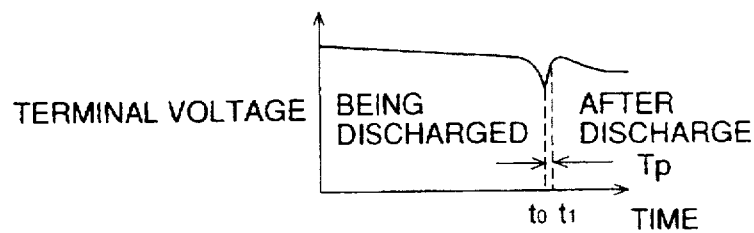
Figure 1D:
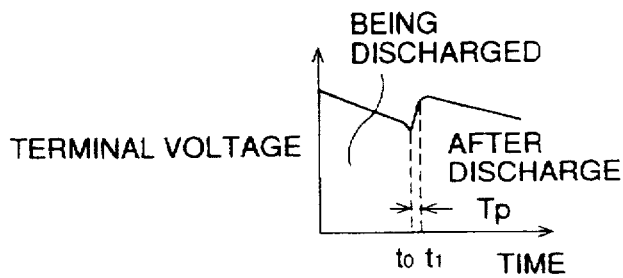
Figure 1E:
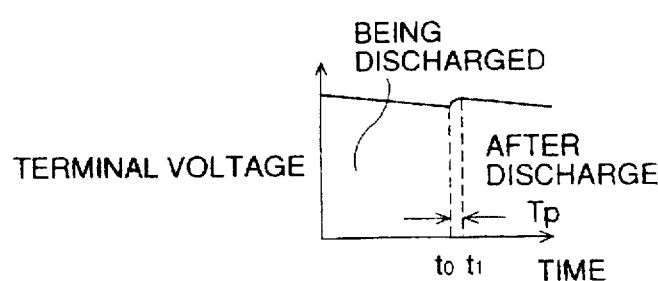

As has been already explained, in the battery management system, it is necessary to always detect the correction value of the battery status such as remaining capacity of the vehicle drive battery by detecting the temperature, the terminal voltage and the lapse of time after use, even when the key switch is kept turned off as when the electric vehicle is kept parked for many hours at night. This is because, as shown in FIG. 1(b), the terminal voltage battery is restored after released open from discharge and further this restoration rate ($\Delta V/\Delta t$) and the specified time $T_p$ shown in FIGS. 1(a) to 1(e) differ according to the past discharge status of the battery. In other words, it is possible to know the deterioration status of the drive battery by measuring the restoration rate of the terminal voltage ($\Delta V/\Delta t$), so that a criterion for exchange the battery with new one can be known.

However, there arises a problem in that the current consumption required for the battery management system increases when the battery is monitored at the short monitoring start period (e.g., one min) the same as when the key switch is turned on, even after the key switch is turned off (i.e., the electric vehicle is parked), so that the auxiliary battery is used up for battery control.

Therefore, the battery management methods according to the present invention will be described hereinbelow in order to overcome this problem in more finely, in dependency on the management system of the first embodiment shown in FIGS. 1 and 2 and with reference to the attached flowcharts.

(Fifth embodiment)

Figure 11:
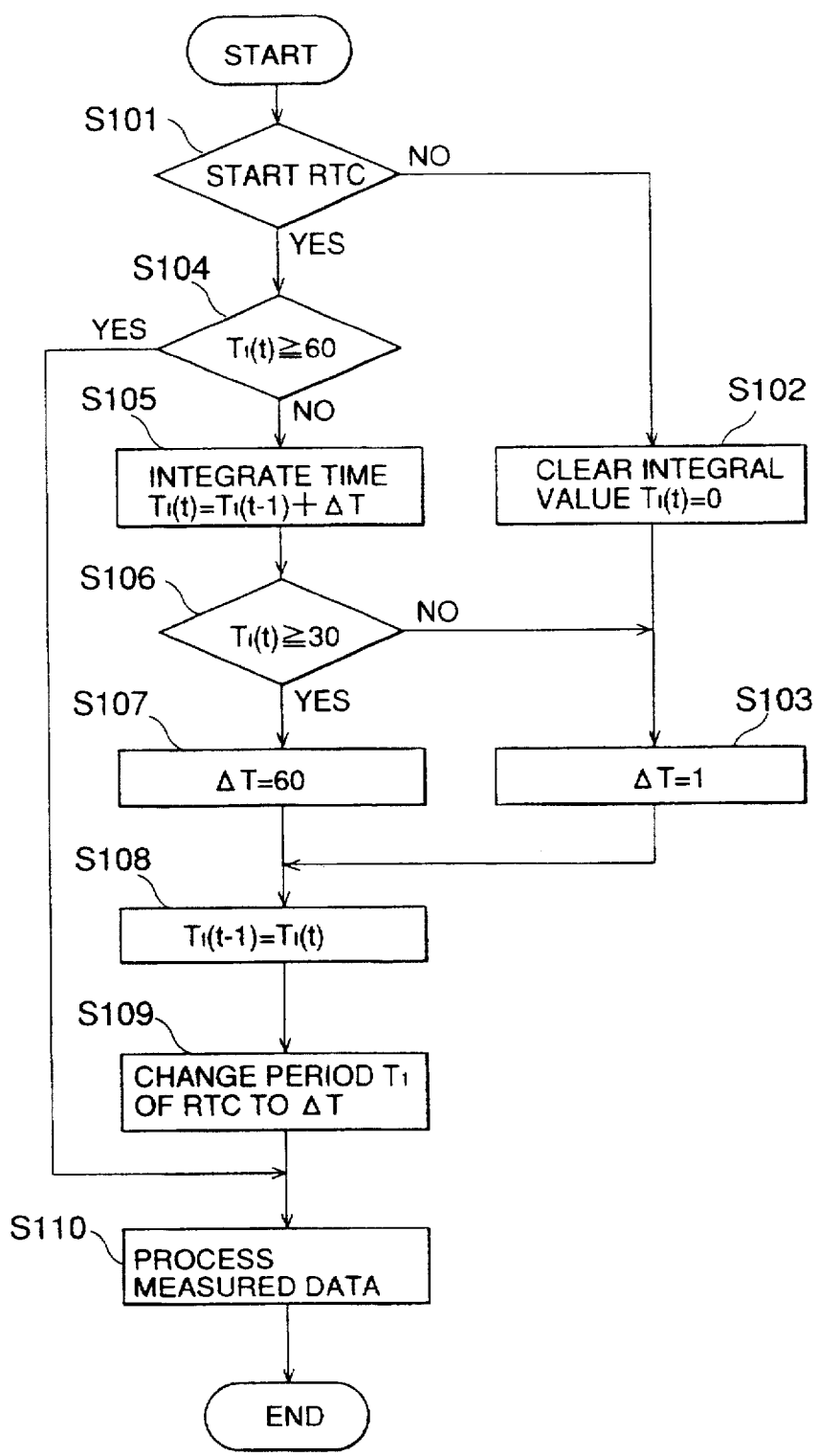
FIG. 11 is a flowchart for assistance in explaining the operation according to the fifth embodiment of the present invention.

The fifth embodiment of the present invention will be described hereinbelow with reference to a flowchart (battery monitoring routine) shown in FIG. 11, which can be executed periodically at a predetermined monitoring start period whenever the CPU 14 and the sensor group 11 are activated by the auxiliary battery 8.

The feature of this fifth embodiment is to switch the monitoring start period from a short period (e.g., one minute) to a long period such as one hour in dependency on a predetermined specified time $T_p$ (e.g., 30 minutes) after the battery has been released open after discharge.

In step S101, the CPU 14 (referred to as control hereinafter, simply) checks whether the RTC generator 13 activated in linkage with the key switch 17 is started or not (turned off or on). If the RTC generator 13 is not started, that is, when the key switch 17 is turned on, control proceeds to step S102 to clear the integrated time value $TI_{(t)}$ as $TI_{(t)}=0$, proceeding to step S103. Further, the integrated time value indicates a time elapsed after the key switch 17 is turned off; that is, after the battery is released open after discharge.

On the other hand, if the RTC generator 13 is started, that is, when the key switch 17 is turned off, control proceeds to step S104 to check whether the integrated time value $TI_{(t)}$ is equal to or longer than 60 minutes ($TI_{(t)} \geq 60$). If there is $TI_{(t)} > 60$, control jumps to step S110, and if there is $TI_{(t)} < 60$, control proceeds to step S105. In step S105, control integrates the time elapsed as $TI_{(t)} = TI_{(t-1)} + \Delta T$, where $T_{(t-1)}$ denotes the preceding integrated time value, and $\Delta T$ denotes a time interval between the preceding time to the current time which is the same as the short monitoring start period.

Further, in step S106, control checks where the integrated time value $TI_{(t)}$ is equal to or longer than a fixed specified time 30 minutes. If $TI_{(t)}$ is shorter than 30 minutes ($TI_{(t)} < 30$), control proceeds to step S103, and if $TI_{(t)}$ is equal to or longer than 30 minutes ($TI_{(t)} \geq 30$), control proceeds to step S107. Here, the specified time of 30 minutes is a time period from when the key switch 17 is turned off (the battery is released open) to when the terminal voltage is restored to a peak value, as already explained with reference to FIGS. 1(a) to 1(e).

Here, if the key switch 17 is turned on or within the specified time (30 minutes), control proceeds from step S102 or step S106 to step S103 to set the monitoring start period $\Delta T$ to a short monitoring start period of one minute, proceeding to step S108.

Further, in step S106, if the integrated time value $TI_{(t)}$ is equal to or longer than the fixed specified time of 30 minutes ($TI_{(t)} \geq 30$), control proceeds to step S107 to set the monitoring start period $\Delta T$ to a long monitoring start period of one hour, proceeding to step S108.

In step S108, control replaces the preceding integrated time value $TI_{(t-1)}$) with the current integrated time value $TI_{(t)}$, proceeding to step S109. Further, in step S109, control changes the period T1 of the RTC (the same as the monitoring start period $\Delta T$) to a value obtained in step S103 (one minute) or S107 (one hour), proceeding to step silo.

Further, when the integrated time value $TI_{(t)}$ is determined to be equal to or longer than 60 minutes in step S104, or when control proceeds from step S109 to step S110, in step S110 control executes various data measurement processing; that is, the various sensor condition signals (the terminal voltage, temperature, and current) of the sensor group 11 are converted into digital signals via the A/D converter 15; the status of the high voltage battery 4 is calculated on the basis of the converted digital signals by the CPU 14; and stored in the memory element 12. Further, the battery status stored in the memory element 12 are outputted to the vehicle control unit 9 via a bus. Further, here, the battery status is a power consumption, a remaining battery capacity, a battery deterioration and the like.

As a result, under the conditions that the key switch 17 is turned on, a short monitoring start period of one minute is set to the period T1 of the non-activated RTC generator 13 as an initial set value. Further, after that, after the key switch 17 has been turned off, the switching element 16 outputs a RTC signal at a short monitoring start period of one minutes, until the specified time (30 minutes) has elapsed to execute the fine data measurement processing for battery management by supplying power to the CPU 14 at a short monitoring start period (one minute). However, after the specified time of 30 minutes has elapsed, since the monitoring starting period is changed to a long monitoring start period of 60 minutes, it is possible to execute the battery measurement processing at long time intervals, thus saving the power consumed by the battery management.

As described above, in the fifth embodiment according to the present invention, battery data are measured finely at relatively short time intervals (one minute) when the terminal voltage changes abruptly until the specified time. However, battery data are measured coarsely at relatively long time intervals (one hour) when the terminal voltage changes gently after specified time, with the result that it is possible to monitor the status of the high voltage battery (drive battery) 4 even when the key switch 17 is kept turned off, without increasing the current consumption of the auxiliary battery 8.

Further, in this fifth embodiment, the respective values of the short monitoring start period, the long monitoring start period and the specified time are not limited to only the values as described above, because these values have been explained only by way of example.

(Sixth embodiment)

The sixth embodiment of the present invention will be described with reference to a flowchart shown in FIG. 12.

The feature of this sixth embodiment is to switch the monitoring start period from a short period such as one minute to a long period such as one hour in dependency on a predetermined reference restoration voltage $V_{ref}$ after the battery has been released open after discharge. That is, after the key switch is turned off, if a change rate $\Delta V$ of the terminal voltage of the battery is higher than a predetermined reference voltage $V_{ref}$ the data measurement processing is repeated at a predetermined short monitoring start period. However, if the change rate $\Delta V$ of the terminal voltage of the battery is lower than the same reference voltage $V_{ref}$, the data measurement processing is repeated at a predetermined long monitoring start period.

In the same way as with the case of the fifth embodiment, the management or monitoring routine can be executed repeatedly whenever the CPU 14 and the sensor group 11 are activated.

In step S201, control checks as to whether the RTC generator 13 activated in linkage with the key switch 17 is started or not (turned off or on). If the RTC generator 13 is not started, that is, when the key switch 17 is turned on, control jumps to step S204 to set the monitoring start period $\Delta T$ to a short period of one minute. However, if the RTC generator 13 is started, that is, when the key switch 17 is turned off, control proceeds to step S202 to calculate the terminal voltage change rate $\Delta V = V_{(t)} - V_{(t-1)}$. Here, $V_{(t-1)}$ denotes the preceding terminal voltage and $V_{(t)}$ denotes the current terminal voltage.

Further, in step S203, control checks as to whether the calculated terminal voltage change rate $\Delta V$ is equal to or larger than a reference voltage $V_{ref}$. If the rate $\Delta V$ is equal to or larger than a reference voltage $V_{ref}$, control proceeds to step S204. If the rate $\Delta V$ is smaller than the voltage $V_{ref}$, control proceeds to step S205.

When control proceeds from step S201 (when the key switch 17 is turned on) or step S203 (when the key switch is turned off but $\Delta V \geq V_{ref}$) to S204, control sets a short monitoring start period of one minute to the monitoring start period $\Delta T$, proceeding to S206.

Further, when control proceeds from step S203 to step S205 ($\Delta V < V_{ref}$), control sets a long monitoring start period of one hour to the monitoring start period $\Delta T$, proceeding to S206.

In step S206, control replaces the preceding terminal voltage $V_{(t-1)}$ with the current terminal voltage $V_{(t)}$, proceeding to step S207. Further, in step S207, control changes the period T1 of the RTC generator 13 to the monitoring start period $\Delta T$ obtained in step S204 (one minute) or S205 (one hour), proceeding to step S208.

Further, in step S208, control executes various data measurement processing; that is, the various sensor signals such as the terminal voltage, temperature, and current of the sensor group 11 are converted into digital signals via the A/D converter 15; the status of the high voltage battery 4 is calculated in dependency on the converted digital signals by the CPU 14; and stored in the memory element 12. Further, the battery status stored in the memory element 12 are outputted to the vehicle control unit 9 via the bus. Further, here, the battery status is a power consumption, a remaining battery capacity, a battery deterioration.

As a result, under the conditions that the key switch 17 is turned on, a short monitoring start period of one minute is set to the period T1 of the non-activated RTC generator 13 as an initial set value. On the other hand, when the change rate $\Delta V$ of the terminal voltage is equal to or more than the reference voltage $V_{ref}$ after the key switch 17 has been turned off, the CPU 14 is activated to execute the control processing at a short monitoring start period of one minute, so that a fine battery management can be executed according to a sharp change rate of the battery voltage. On the other hand, if the change rate $\Delta V$ of the terminal voltage is less than the reference voltage $V_{ref}$ after the key switch 17 has been turned off, the CPU 14 is activated to execute the management processing at a long monitoring start period of one hour, so that a simple battery management method can be executed according to a gentle change rate of the battery voltage.

As described above, in the sixth embodiment according to the present invention, since the fine data measurement processing can be executed by setting the monitoring period to a relatively short period when the terminal voltage changes abruptly, and further since the simple data measurement processing can be executed by setting the monitoring period to a relatively long period when the terminal voltage changes gently, it is possible to monitor the status of the high voltage battery (drive battery) 4 even when the key switch 17 is kept turned off, without increasing the current consumption of the auxiliary battery 8.

Further, in this sixth embodiment, the respective values of the short monitoring start period and the long monitoring start period are not limited to only the values, because these values have been explained above only by way of example.

Figure 12:
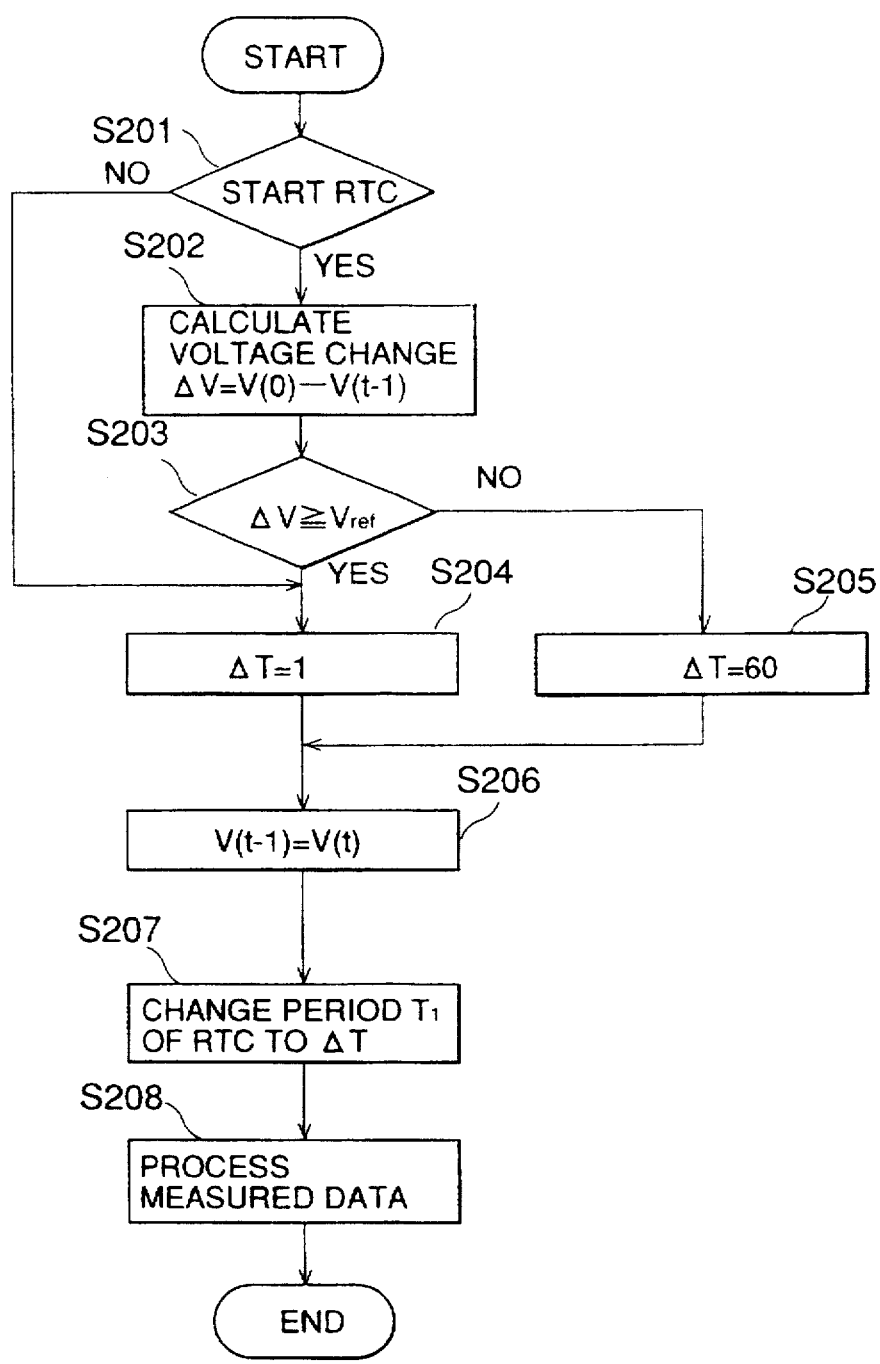
FIG. 12 is a flowchart for assistance in explaining the operation according to the sixth embodiment of the present invention.
Figure 13:
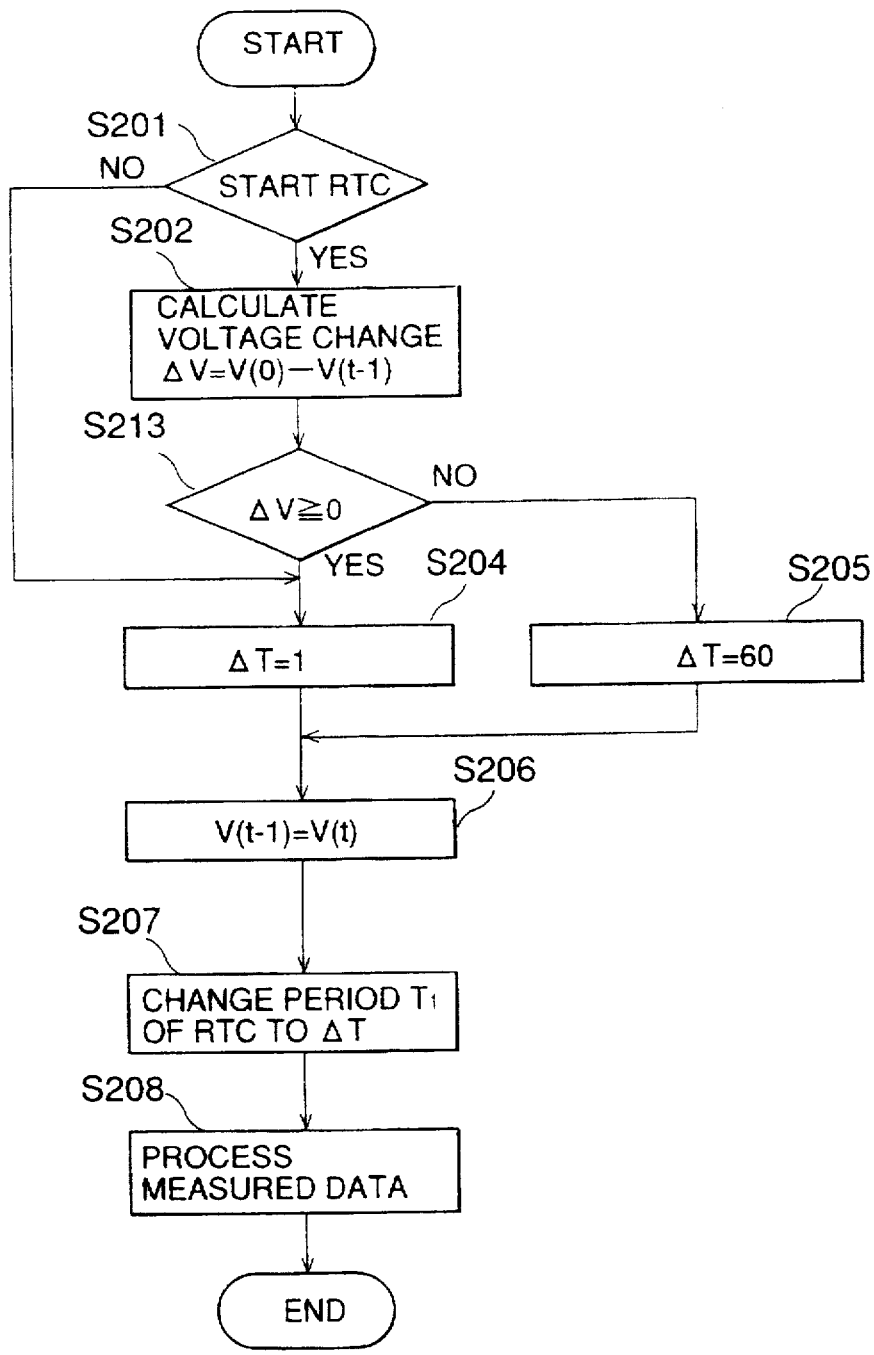
FIG. 13 is a flowchart for assistance in explaining the operation according to a modification of the sixth embodiment of the present invention.

FIG. 13 shows a modification of the sixth embodiment shown in FIG. 12. In this modification, the reference voltage $V_{ref}$ is set to zero volts. That is, the data measurement processing is executed at a predetermined short monitoring start period when the change rate of the terminal voltage of the high voltage battery is equal to or higher than zero, after the key switch is turned off. However, when the change rate of the terminal voltage of the high voltage battery is negative, the data measurement processing is executed at a predetermined long monitoring start period.

In more detail, in the control routine shown in FIG. 13, in step S202, control calculates the change rate of the battery terminal voltage $\Delta V$. Further, in step S213, control checks as to whether change rate $\Delta V$ is equal to or large than zero. If there is $V \geq 0$, control proceeds to step S204, and if no ($\Delta V < 0$), control proceeds to step S205. The steps other than the above are quite the same as the case of the fifth embodiment shown in FIG. 12.

(Seventh embodiment)

Figure 14:
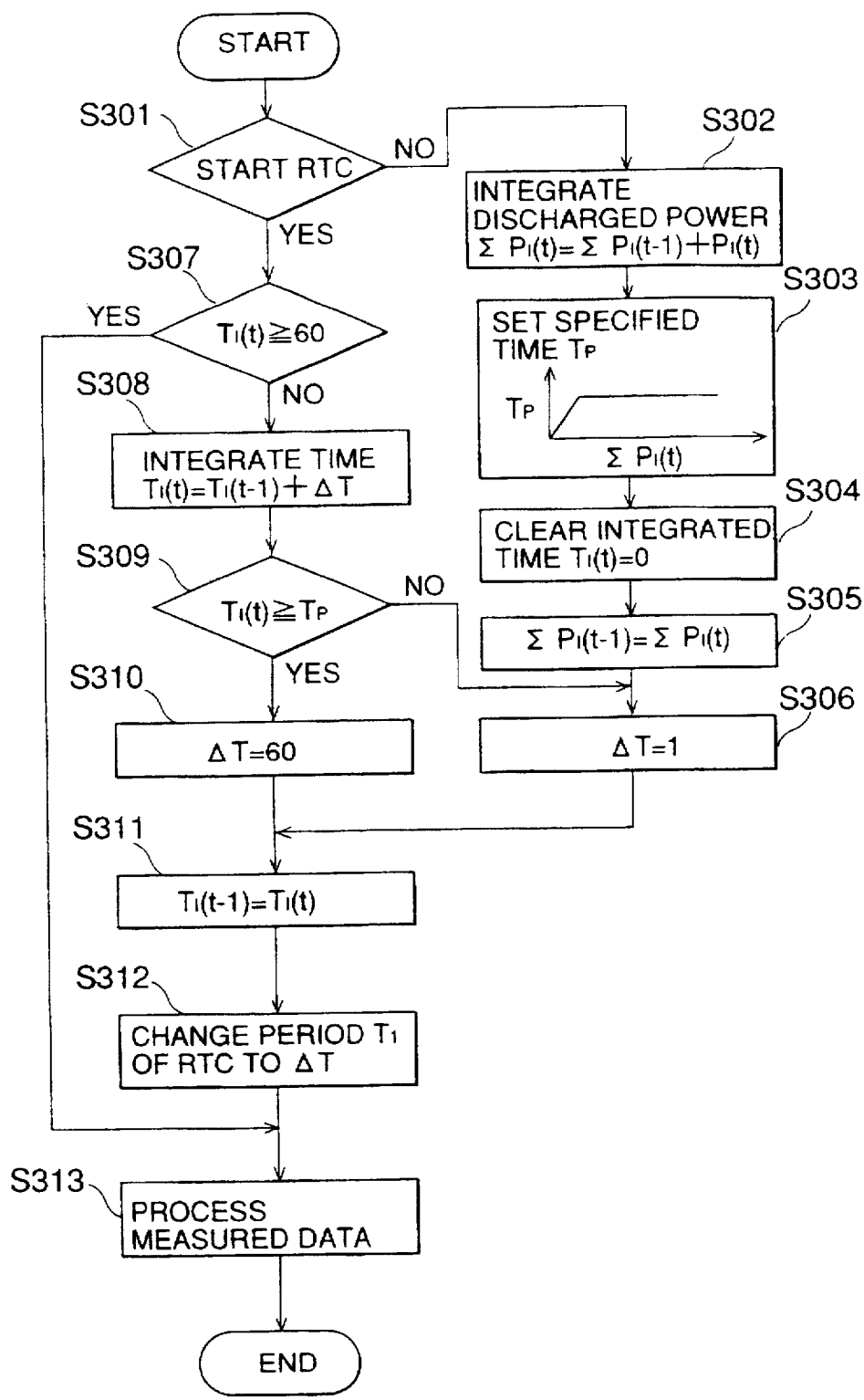
FIG. 14 is a flowchart for assistance in explaining the operation according to the seventh embodiment of the present invention.

The seventh embodiment will be described hereinbelow with reference to FIG. 14. The feature of this embodiment is that a specified time $T_p$ is decided on the basis of the integrated discharged power of the high voltage battery calculated when the key switch is kept turned on and that the data measurement processing is executed at a short monitoring start period within the decided specified time but at a long monitoring start period after the decided specified time. In the same way as the case of the fifth embodiment, the management or monitoring routine can be executed repeatedly whenever the CPU 14 and the sensor group 11 are activated.

Therefore, in step S301, the CPU 14 (control) first checks as to whether the RTC generator 13 activated in linkage with the key switch 17 is started or not (turned off or on). If the RTC generator 13 is not started when the key switch 17 is turned on, control proceeds to step S302. If the RTC generator 13 is started (i.e., when the key switch 17 is turned off), control proceeds to step S307.

In step S302, control calculates an integrated discharged power $\Sigma PI_{(t)} = \Sigma PI_{(t-1)} + PI_{(t)}$ (where $\Sigma PI_{(t-1)}$ denotes the preceding integrated discharged power), proceeding to step S303.

In step S303, control obtains a specified time $T_p$ with reference to a map and on the basis of the calculated discharged power $\Sigma PI_{(t)}$. This specified time $T_p$ is a time period from when the key switch 17 is turned off so that the battery 4 is released open from discharge to when the battery terminal voltage is restored to its peak value. Further, the map between the specified time $T_p$ and the integrated discharged power $\Sigma PI_{(t)}$ can be obtained empirically and stored previously in the memory element 12. The specified time $T_p$ is determined to be long with increasing discharged power $\Sigma PI_{(t)}$ and constant such as 30 minutes after the discharged power $\Sigma PI_{(t)}$ exceeds a value.

After the specified time $T_p$ has been set in step S303, control proceeds to step S304, to clear the integrated time value $TI_{(t)}$ as $TI_{(t)} = 0$, proceeding to step S305. Here, the integrated time value $TI_{(t)}$ is an integral value of the time after the key switch 17 has been kept turned off. Further, in step S305, control replaces the integrated discharged power $\Sigma PI_{(t-1)}$ with the current integrated discharged power $\Sigma PI_{(t)}$ as $\Sigma PI_{(t-1)} = \Sigma PI_{(t)}$, proceeding to step S306.

On the other hand, control proceeds to step S307 to check as to whether the integrated time value $TI_{(t)}$ is equal to or longer than 60 minutes ($TI_{(t)} \geq 60$) when the RTC generator 13 is started and thereby the key switch 17 is turned off. If there is $TI_{(t)} \geq 60$, control jumps to step S313. If there is $TI_{(t)} < 60$, control proceeds to step S308. In step S308, control integrates the time as $TI_{(t)} = TI_{(t-1)} + \Delta T$, where $TI_{(t-1)}$ denotes the preceding integral value and $\Delta T$ denotes a time change rate between the preceding time and the current time which is the same as the monitoring start time.

Further, in step S309, control checks where the integrated time value $TI_{(t)}$ is equal to or longer than the set specified time $T_p$. If $TI_{(t)}$ is shorter than the specified time ($TI_{(t)}<T_p$), control proceeds to step S306. If $TI_{(t)}$ is equal to or longer than the specified time ($TI_{(t)} \geq T_p$), control proceeds to step S310.

Further, when control proceeds from the step S305 (the key switch 17 is turned on) or S309 (the time after the key switch 17 is turned off, does not reach the specified time $T_p$) to step S306, control sets the period $\Delta T$ ($T_1$) of the RTC generator 13 to a short monitoring start period such as one minute, proceeding to step S311.

Further, in step S309, if the integral time value $TI_{(t)}$ is equal to or longer than the set specified value $T_p$ ($TI_{(t)} \geq T_p$), control proceeds to step S310, to set the period $\Delta T$ ($T_1$) of the RTC generator 13 to a long monitoring start period (e.g., one hour), proceeding to step S311.

In step S311, control replaces the preceding integrated time value $TI_{(t-1)}$ with the current integrated time value $TI_{(t)}$ ($TI_{(t-1)}=TI_{(t)}$), proceeding to step S312. Therefore, the period TI of the RTC generator 13 is set to the monitoring start period $\Delta T$ determined in steps S306 or S310.

Further, control proceeds from step S312 to step S313 when control determines the integrated value $TI_{(t)}$ is longer than 60 minutes in step S307. In step S313, control executes various data measurement processing; that is, the various sensor signals such as the terminal voltage, temperature, and discharge current of the sensor group 11 are converted into digital signals via the A/D converter 15; the status of the high voltage battery 4 is calculated in dependency on the converted digital signals by the CPU 14; and stored in the memory element 12. Further, the battery status stored in the memory element 12 are outputted to the vehicle control unit 9 via the bus. Further, here, the battery status is a discharge current, a power consumption, a remaining battery capacity, a battery deterioration and the like.

As a result, under the conditions that the key switch 17 is turned on, a short monitoring start period of one minute is set to the period T1 of the non-activated RTC generator 13 as an initial set value. Therefore, the RTC generator 13 outputs a RTC at a short monitoring start period of one minute from when the key switch 17 is turned off to when the specified time decided on the basis of the discharged power has elapsed, so that power is supplied to the CPU 14 and the sensor group 11 at a short monitoring start period (one minute) until the specified time has elapsed to execute the fine data measurement processing for battery management. Further, since the monitoring start period is changed to a long monitoring start period of one hour, after the specified time of one minute has elapsed it is possible to execute the coarse battery measurement processing at long time intervals.

As described above, in the seventh embodiment according to the present invention, since the specified time is determined in dependency on the integrated discharged power, it is possible to monitor the status of the drive battery (the high voltage battery) more accurately, after the key switch of the electric vehicle is turned off, without increasing the current consumption for battery management.

(Eighth embodiment)

Figure 15:
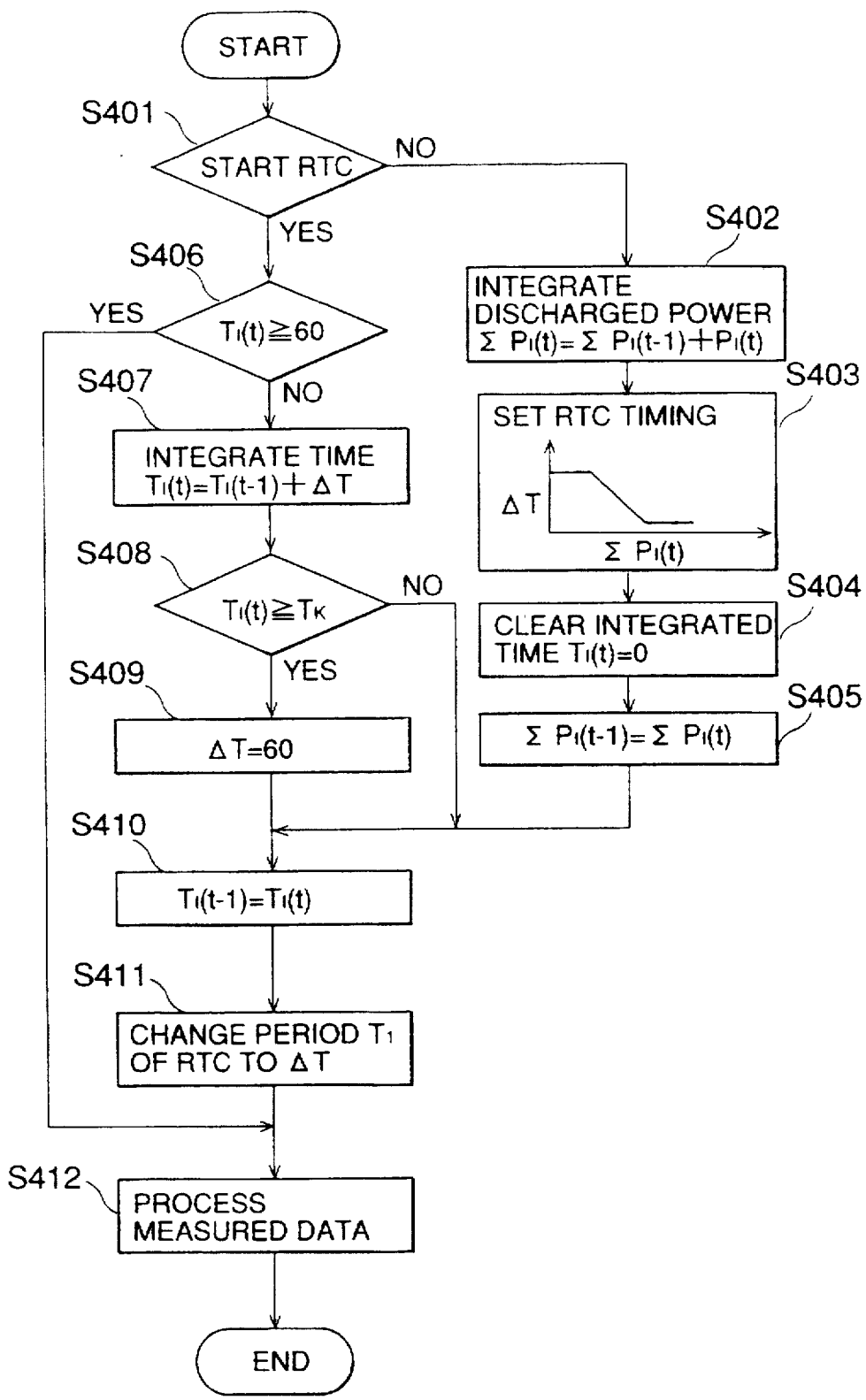
FIG. 15 is a flowchart for assistance in explaining the operation according to the eighth embodiment of the present invention.

The eighth embodiment will be described hereinbelow with reference to FIG. 15. The feature of this embodiment is that a short monitoring start period is first decided in dependency on the integrated discharged power of the high voltage battery when the key switch is kept turned on and that the data measurement processing is executed at the decided short monitoring start period within a specified time but at a long monitoring start period after the set specified time.

In the same way as the case of the fifth embodiment, the management or monitoring routine can be executed repeatedly whenever the CPU 14 and the sensor group 11 are activated.

Therefore, in step S401, the CPU 14 (control) first checks as to whether the RTC generator 13 activated in linkage with the key switch 17 is started or not (turned off or on). If the RTC generator 13 is not started (i.e., when the key switch 17 is turned on), control proceeds to step S402. If the RTC generator 13 is started (i.e., when the key switch 17 is turned off), control proceeds to step S406.

In step S402, control calculates an integrated discharged power $\Sigma PI_{(t)} = \Sigma PI_{(t-1)} + PI_{(t)}$ (where $\Sigma PI_{(t-1)}$ denotes the preceding integrated discharged power), proceeding to step S403.

In step S403, control decides a short monitoring start period $\Delta T$ with reference to a previously determined map in dependency on the calculated integrated discharged power $\Sigma PI_{(t)}$. This short monitoring start period $\Delta T$ is a time period from when the key switch 17 is turned off so that the battery 4 is released open from discharge to when the battery terminal voltage is restored to its peak value. Further, the map between the short monitoring start period $\Delta T$ and the integrated discharged power $\Sigma PI_{(t)}$ can be obtained empirically and stored in the memory element 12. The short monitoring start period $\Delta T$ is determined to be short with increasing integrated discharged power $\Sigma PI_{(t)}$ and constant after the integrated discharged power $\Sigma PI_{(t)}$ exceeds a value.

After the short monitoring start period $\Delta T$ has been set in step S403, control proceeds to step S404, to clear the integrated time value $TI_{(t)}$ as $TI_{(t)}=0$, proceeding to step S405. Here, the integrated time value $TI_{(t)}$ is a time value after the key switch 17 has been turned off. Further, in step S405, control replaces the integrated discharged power $\Sigma PI_{(t-1)}$ with the current integrated discharged power $\Sigma PI_{(t)}$ as $\Sigma PI_{(t-1)} = \Sigma PI_{(t)}$, proceeding to step S410.

On the other hand, when the RTC generator 13 is started and thereby the key switch 17 is turned off in step S401, control proceeds to step S406 to check as to whether the integrated time value $TI_{(t)}$ is equal to or longer than 60 minutes ($TI_{(t)} \geq 60$). If there is $TI_{(t)} \geq 60$, control jumps to step S412. If there is $TI_{(t)} < 60$, control proceeds to step S407. In step S407, control integrates the time as $TI_{(t)}=TI_{(t-1)}+\Delta T$, where $TI_{(t-1)}$ denotes the preceding integral time value and $\Delta T$ denotes a time between the preceding time and the current time (the same as the short monitoring start period $\Delta T$).

Further, in step S408, control checks as to whether the integrated time value $TI_{(t)}$ is equal to or longer than the predetermined specified time $T_k$ (e.g., 30 minutes). If the integrated time value $TI_{(t)}$ is shorter than the specified time ($TI_{(t)}<T_k$), control proceeds to step S410. If the integrated time value $TI_{(t)}$ is equal to or longer than the specified time ($TI_{(t)} \geq T_k$), control proceeds to step S409.

Further, control proceeds from the step S409 to step S410 to set a long monitoring start period such as one hour to the monitoring start period $\Delta T$, proceeding to step S410.

Therefore, $\Delta T$ is set to the short monitoring start period decided in step S403 from a time when the key switch 17 is turned on to a time when the specified time $T_K$ has elapsed. However, $\Delta T$ is set to the long monitoring start period such as 60 minutes decided in step S409 when the specified time $T_k$ has elapsed (i.e., after the specified time $T_k$.

Further, when control proceeds from the step S405 or S408 (ΔT is the short monitoring start period) or from the step S409 (ΔT is the long monitoring start period), control replaces the preceding integrated time value $TI_{(t-1)}$ with the current integrated time value $TI_{(t)}$ as ($TI_{(t-1)}=TI_{(t)}$), proceeding to step S411. Therefore, the period TI of the RTC generator 13 is set to the monitoring start period ΔT determined in steps S403 or S409, proceeding to step S412.

Further, control proceeds from step S411 to step S412 when control determines the integrated value $TI_{(t)}$ is equal to or longer than 60 minutes in step S406. In step S412, control executes various data measurement processing; that is, the various sensor signals (the terminal voltage, temperature, and discharge current) of the sensor group 11 are converted into digital signals via the A/D converter 15; the status of the high voltage battery 4 is calculated on the basis of the converted digital signals by the CPU 14; and stored in the memory element 12. Further, the battery status stored in the memory element 12 are outputted to the vehicle control unit 9 via the bus. Further, here, the battery status is a power consumption, a remaining battery capacity, and a battery deterioration.

As a result, under the conditions that the key switch 17 is turned on, a short monitoring start period is set to the period T1 of the non-activated RTC generator 13 as an initial set value. Therefore, the RTC generator 13 outputs an RTC at a short monitoring start period from a time when the key switch 17 is turned off to a time when the specified time decided on the basis of the integrated discharged power has elapsed. Accordingly, power is supplied to the CPU 14 and the sensor group 11 at a short monitoring start period until the specified time has elapsed to execute the fine data measurement processing for battery management. Further, since the monitoring start period is changed to a long monitoring start period of 60 minutes after the specified time has elapsed, it is possible to execute the coarse battery measurement processing at long time intervals.

As described above, in the eighth embodiment according to the present invention, since the short monitoring start period is set on the basis of the integrated discharged power, it is possible to monitor the status of the drive battery (the high voltage battery) when the key switch of the electric vehicle is turned off more accurately, without increasing the current consumption.

Further, in this eighth embodiment, the long monitoring start period is not limited to only 60 minutes.

Further, in the above-mentioned embodiments, although the AC induction motor is used as the vehicle drive motor without being limited only thereto, it is of course possible to use an AC synchronous motor or a DC motor.

Further, in the above-mentioned embodiment, although the real time clock is determined in such a way that the low-level pulse width $T_2$ is 0.1 second and the period $T_1$ is one minute or one hour, the real time clock is of course not limited only to these values.

Further, in the above-mentioned embodiment, although the lead battery is explained by way of example, the present invention can be applied to the other battery such as Ni—Cd, Ni—H, Ni—Zn, Na—S, Li battery and the like.

As described above, in the battery management system according to the present invention, since the battery status can be monitored by reducing the power consumption whenever the key switch is kept turned on, it is possible to save power required for always monitoring the battery status.

While the presently preferred embodiments of the present invention have been shown and described, it is to be understood that this disclosure is for the purpose of illustration and that various changes and modification may be made without departing from the scope of the invention as set forth in the appended claims.

What is claimed is:

1. A battery management system for an electric vehicle, comprising:

detecting means for detecting various battery conditions of a car battery mounted on the electric vehicle;

management means for monitoring a battery status of the car battery in dependency on the various battery conditions detected by said detecting means;

storing means for storing the battery status monitored by said management means;

key switching means connected to an auxiliary battery, for activating said detecting means and said management means whenever turned on; and activating means associated with said key switching means, for periodically activating said detecting means and said management means when said key switching means is turned off.

2. The battery management system according to claim 1, wherein said activating means comprises:

a real time clock generator for generating a clock signal; and a first switching element connected in parallel to said key switching means, for supplying power to said detecting means and said management means in response to the clock generated by said real time clock generator, said real time clock generator and said first switching element being both connected to the auxiliary battery.

3. The battery management system according to claim 2, further comprising:

a backup battery for activating said real time clock generator, said backup battery being recharged by a battery charger activated when said key switching-means is turned on.

4. The battery management system according to claim 2, further comprising:

a second switching element connected between said real time clock generator and said first switching element; and a thyristor connected to said second switching element and activated by said management means, to activate said detecting means and said management means only during a monitoring routine is being executed.

5. The battery management system according to claim 2, further comprising:

a relay connected in parallel to said key switching means; and a charge coupler for energizing said relay to supply an external power to said detecting means and said management means continuously for monitoring the car battery, only when the car battery is being charged.

6. The battery management system according to claim 2, which further comprising:

a charge coupler for supplying an external power directly to said detecting means and said management means continuously for monitoring the car battery, only when the car battery is being charged.

7. The battery management system according to claim 2, which further comprising:

the detecting means having a plurality of separated detecting means, and a diode connected between two of said separated detecting means, to reduce the number of detecting means activated when said key switching means is turned off.

8. The battery management system according to claim 1, wherein the various battery conditions detected by said detecting means are a terminal voltage, a terminal temperature, a discharged current, and a time elapsed after released open from discharge.

9. The battery management system according to claim 1, wherein the battery status monitored and controlled by said management means is a power consumption rate, a remaining battery capacity, and a battery deterioration.

10. The battery management system according to claim 1, wherein said activating means activates said detecting means and said management means according to a monitoring start period ($\Delta T$) determined in dependency on a restoration status of battery terminal voltage obtained after the car battery has been released open from discharge.

11. The battery management system according to claim 10, wherein the restoration status of the battery terminal voltage is represented by a specified time ($T_p$) from when the car battery has been released open from discharge to when the terminal voltage is restored to a peak value, a restoration voltage ($\Delta V$) between a terminal voltage immediately before released open and the peak value, and a restoration rate ($\Delta V/\Delta t$ or $\Delta V/T_p$).

12. The battery management system according to claim 10, wherein the monitoring start period ($\Delta T$) of said activating means is determined on the basis of a fixed specified value ($T_p$) representative of the restoration status of battery terminal voltage, said monitoring start period being shorter within the fixed specified time ($T_p$) than after the fixed specific time.

13. The battery management system according to claim 12, wherein said fixed specified value ($T_p$) is determined based on an integrated discharged power ($\Sigma PI_{(n)}$).

14. The battery management system according to claim 13, wherein the specified time ($T_p$) is determined with reference to a map determined empirically.

15. The battery management system according to claim 12, wherein the monitoring start period ($\Delta T$) within the fixed specified time ($T_p$) is further adjusted based on an integrated discharged power ($\Sigma PI_{(n)}$).

16. The battery management system according to claim 15, wherein the monitoring start period ($\Delta T$) within the fixed specified time is determined with reference to a map determined empirically.

17. The battery management system according to claim 10, wherein the monitoring start period ($\Delta T$) of said activating means is determined on the basis of a restoration voltage ($\Delta V$) representative of the restoration status of battery terminal voltage, said monitoring start period being shorter when the restoration voltage ($\Delta V$) is equal to or higher than a reference voltage ($V_{ref}$) than when the restoration voltage ($\Delta V$) is lower than the reference voltage.

18. The battery management system according to claim 17, wherein the reference voltage ($V_{ref}$) is set to zero volts.

19. A method of managing a battery mounted on an electric vehicle, comprising the steps of:

checking whether a real time clock (RTC) is being started to activate a battery monitoring routine intermittently after the battery is released open from discharge;

executing a battery monitoring routine at a short monitoring start period when said RTC is not being started to activate the battery monitoring routine;

determining a long monitoring start period ($\Delta T$) according to restoration status of battery terminal voltage obtained after the battery has been released open from discharge when said RTC is being started to activate the battery monitoring routine, the long monitoring start period being longer than the short monitoring start period;

changing the period (T1) of the real time clock to the determined monitoring start period ($\Delta T$);

processing monitored battery data to detect battery status for recharging or replacement.

20. The method of managing the battery according to claim 19, wherein the step of determining a long monitoring start period ($\Delta T$) according to restoration status of battery terminal voltage comprises the steps of:

determining time elapsed after the battery has been released open from discharge;

checking whether the determined time value is equal to or longer than a fixed specified time;

setting a determined monitoring start period to be the long monitoring start period ($\Delta T$) when the integrated time value is equal to or longer than the fixed specified time; and setting the determined monitoring start period to be the short monitoring start period when the integrated time value is shorter than the fixed specified time.

21. The method of managing the battery to claim 20, further comprising the steps of:

integrating power ($\Sigma PI_{(n)}$) discharged from the battery when the real time clock (RTC) is not being generated; and determining the fixed specified time ($T_p$) on the basis of the integrated discharged power.

22. The method of managing the battery according to claim 21, wherein the specified time ($T_p$) is determined with reference to a map determined empirically.

23. The method of managing the battery according to claim 20, further comprising the steps of:

integrating power ($\Sigma PI_{(n)}$) discharged from the battery when the real time clock (RTC) is not being generated; and determining the short monitoring start period ($\Delta T$) on the basis of the integrated discharge power.

24. The method of managing the battery according to claim 23, wherein the short monitoring start period ($\Delta T$) is determined with reference to a map determined empirically.

25. The method of managing the battery according to claim 19, wherein the step of determining a long monitoring start period ($\Delta T$) according to restoration status of battery terminal voltage comprises the steps of:

integrating terminal voltage change ($\Delta V$) after the battery has been released open from discharge;

checking whether the integrated terminal voltage ($\Delta V$) is equal to or higher than a reference voltage ($V_{ref}$);

setting a determined monitoring start period to be the short monitoring start period ($\Delta T$) when the integrated terminal voltage ($\Delta V$) is equal to or higher than the reference voltage ($V_{ref}$); and setting the determined monitoring start period to be the long monitoring start period when the integrated terminal voltage ($\Delta V$) is lower than the reference voltage ($V_{ref}$).

26. The method of managing the battery according to claim 25, wherein the reference voltage ($V_{ref}$) is set to zero volts.

* * * * *